US007065427B1

(12) United States Patent
Dakshina-Murthy et al.

(10) Patent No.: US 7,065,427 B1
(45) Date of Patent: *Jun. 20, 2006

(54) OPTICAL MONITORING AND CONTROL OF TWO LAYERS OF LIQUID IMMERSION MEDIA

(75) Inventors: Srikanteswara Dakshina-Murthy, Wappingers Falls, NY (US); Bhanwar Singh, Morgan Hill, CA (US); Ramkumar Subramanian, Sunnyvale, CA (US); Bharath Rangarajan, Sunnyvale, CA (US); Khoi A. Phan, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 53 days.

This patent is subject to a terminal disclaimer.

(21) Appl. No.: 10/979,367

(22) Filed: Nov. 1, 2004

(51) Int. Cl.
*G06F 19/00* (2006.01)
*G02B 7/00* (2006.01)
*H01L 21/00* (2006.01)

(52) U.S. Cl. .................. 700/120; 700/117; 700/118; 700/119; 700/120; 438/5; 438/7; 438/16; 359/896; 430/30

(58) Field of Classification Search .......... 700/117, 700/121, 118, 119, 120; 438/7, 16, 5; 430/30; 359/896
See application file for complete search history.

(56) References Cited

U.S. PATENT DOCUMENTS

| 4,894,549 A | 1/1990 | Stengl |
| 5,121,256 A | 6/1992 | Corle et al. |
| 5,900,354 A * | 5/1999 | Batchelder .................. 430/395 |
| 6,617,587 B1 | 9/2003 | Parker et al. |
| 6,844,206 B1* | 1/2005 | Phan et al. .................... 438/7 |
| 2005/0084770 A1* | 4/2005 | Vollrath et al. ................ 430/5 |
| 2005/0205108 A1* | 9/2005 | Chang et al. .................. 134/1 |
| 2005/0231695 A1* | 10/2005 | Wang et al. .................. 355/53 |

* cited by examiner

*Primary Examiner*—Ramesh Patel
(74) *Attorney, Agent, or Firm*—Amin & Turocy, LLP

(57) ABSTRACT

A multi-layer immersion medium monitoring system for a lithographic process monitors characteristics of an immersion medium of a semiconductor manufacturing process. The multi-layer immersion medium includes at least a first liquid of a first density (or viscosity) and a second liquid of a lower density (or viscosity), both of which are interspersed between a final optical component and a semiconductor layer. The higher density layer is provided to reduce turbulence in the immersion medium during the lithographic processes. A scatterometry system monitors optical characteristics of the multi-layer immersion medium to effectuate control of a lithographic process.

20 Claims, 17 Drawing Sheets

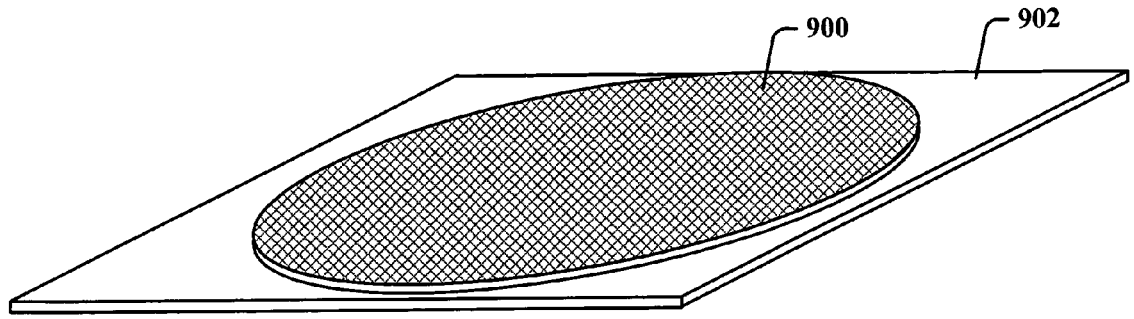
FIG. 9
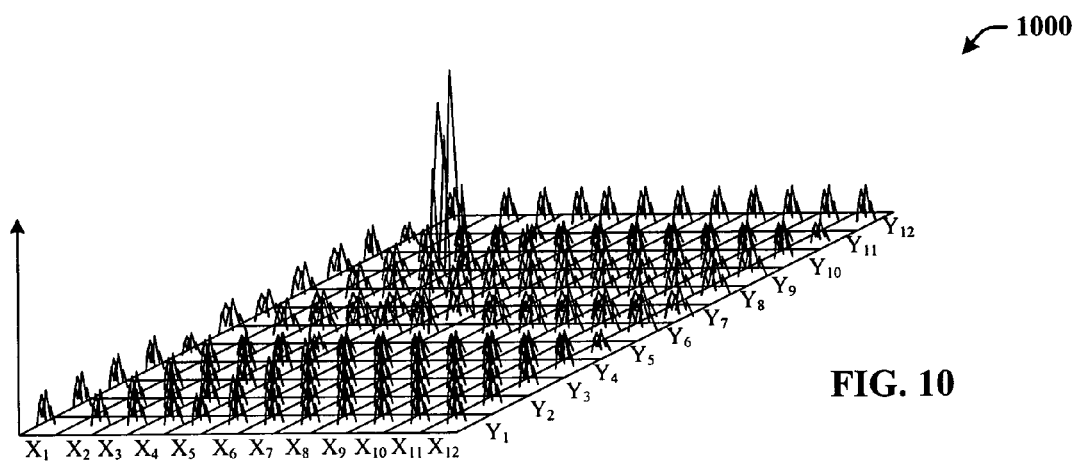
FIG. 10
FIG. 11

OPTICAL MONITORING AND CONTROL OF TWO LAYERS OF LIQUID IMMERSION MEDIA

TECHNICAL FIELD

This invention is related to semiconductor processing, and more specifically, to monitor and control during liquid immersion processing.

BACKGROUND OF THE INVENTION

In the semiconductor industry, there is a continuing trend toward higher device densities. To achieve these high densities there has been and continues to be efforts toward scaling down device dimensions at submicron levels on semiconductor wafers. In order to accomplish such high device packing density, smaller and smaller feature sizes are required. This may include the width and spacing of interconnecting lines and the surface geometry such as corners and edges of various features. The dimensions of and between such small features are referred to the critical dimension (CD). Reducing CDs and reproducing CDs that are more accurate facilitates achieving higher device densities.

High-resolution lithographic processes are used to achieve small features. In general, lithography refers to processes for pattern transfer between various media. In lithography for integrated circuit fabrication, a silicon slice, the wafer, is coated uniformly with a radiation-sensitive film, the photoresist. The film is selectively exposed with radiation (e.g., optical light, x-ray, and electron beam) through an intervening master template (e.g., mask, and reticle) forming a particular pattern (e.g., patterned resist). Dependent upon coating type, exposed areas of the coating become either more or less soluble than unexposed areas in a particular solvent developer. Areas that are more soluble are removed with the developer in a developing step, while less soluble areas remain on the silicon wafer to form a patterned coating. The pattern corresponds to either the image of the mask or its negative. The patterned resist is used in further processing of the silicon wafer.

Efforts to reduce CDs have included implementing various techniques in connection with the lithographic process, such as reducing exposure radiation wavelength (e.g., from 436 nm mercury G-line to 365 nm I-line to 248 nm DUV (deep ultra-violet) to 193 nm excimer laser), improving optical design, and utilizing metrology techniques (e.g., scatterometry and scanning electron microscope (SEM)).

The minimum feature that can be printed with an optical lithography system is determined by the following Rayleigh equation:

$$CD = \frac{k_1 \lambda}{NA},$$

where $k_1$ is the resolution factor, $\lambda$ is the wavelength of the exposing radiation, and NA is the numerical aperture. The NA is defined as a lens' ability to gather diffracted light and resolve fine details onto a wafer, and is actually determined by the acceptance angle of the lens and the index of refraction of the medium surrounding the lens (e.g., air).

Immersion technology offers improved resolution enhancement and higher NAs over conventional projection lithography. In immersion, lithography facilitates further reduction of CDs by employing an immersion fluid in the gap between the final optical component and the wafer being exposed to further focus resolution. The liquid in the gap between the wafer substrate and the final optical component (e.g., lens and scanner) has a refractive index, n, that is greater than the refractive index of air (which is slightly >1), where the refractive index is defined as the ratio of the speed of light in a vacuum to the speed of light in a particular medium. Imaging through the liquid adds the factor of n to the denominator of the Rayleigh equation, resulting in, $$CD = \frac{k_1 \lambda}{nNA}.$$

Utilizing an immersion medium with a refractive index greater than that of air not only increases the NA, but also can decrease the effective wavelength of an exposure radiation propagating within the immersion medium without changing exposure radiation, lasers, lens materials, etc. When a base developer is used as an immersion lithography fluid, the resist is patterned when removing the immersion lithography fluid from the wafer after irradiation. Consequently, the requirement of a separate development step is eliminated, thereby simplifying the lithographic process.

Water is the most common liquid employed in current immersion lithography systems. This is because water has an index of refraction of about 1.47, absorption of less than about 5% at working distances of up to six millimeters, is compatible with most photoresists and lens, and in an ultra-pure form, is non-contaminating. Specifically, the water employed for most immersion applications is double deionized, distilled, and degassed.

However, while the immersion is promising, there are a number of concerns associated with implementing immersion lithography that require solutions before the technology gains wide acceptance. Photoresist material dissolved in the immersion medium can change optical properties of the immersion medium (e.g., refractive index and lithographic constant), thereby impacting efficiency of immersion lithography systems and elevating costs associated with expensive immersion mediums. Moreover, there is a tendency for the immersion liquid to develop micro-bubbles, which ruins the benefits offered by the technology. Maintaining a consistent bubble free liquid between the lens and the wafer is very difficult. Polarization of the lens is also a significant concern. Additionally, immersion lithography typically requires large, expensive lenses.

Thus, there exists a need for an improved architecture for at least the monitor and/or control of immersion medium characteristics in real time.

SUMMARY OF THE INVENTION

The following presents a simplified summary of the invention in order to provide a basic understanding of some aspects of the invention. This summary is not an extensive overview of the invention. It is not intended to identify key/critical elements of the invention or to delineate the scope of the invention. Its sole purpose is to present some concepts of the invention in a simplified form as a prelude to the more detailed description that is presented later.

The present invention disclosed and claimed herein, in one aspect thereof, comprises a multi-layer immersion medium monitor and control system for a lithographic process. The immersion medium utilizes at least two liquids of differing density and viscosities. The multi-layer immersion medium includes at least a first liquid of a first density and a second liquid of a lower density, both of which are interspersed between a final optical component and a semiconductor layer. A scatterometry system monitors optical characteristics of the multi-layer immersion medium to effectuate control of a lithographic process. The system also includes sensors that monitor at least density of the layers and flow of the medium liquids. The optical characteristics are processed to generate a median optical parameter that is used to control the lithographic process. An upper layer is the layer in which the step-and-scan motion of the lithographic tool is performed. The additional and more dense bottom layer reduces turbulence during exposure. The final optical component includes a lens system that moves in an upper layer, and when in position, is lowered into the bottom layer during exposure.

In another aspect of the present invention, the monitor and control system is accessible from a remote location via at least one of wired and wireless access of a computing system. Access further includes the capability of reading data and signals thereof, and providing input that effectuates a change in control parameters of the system for the semiconductor manufacturing process. The computing system can be a remote computer disposed on network in communication with the system, or a handheld computing device that communicates with the system to interact with the data and signals.

To the accomplishment of the foregoing and related ends, certain illustrative aspects of the invention are described herein in connection with the following description and the annexed drawings. These aspects are indicative, however, of but a few of the various ways in which the principles of the invention may be employed and the present invention is intended to include all such aspects and their equivalents. Other advantages and novel features of the invention may become apparent from the following detailed description of the invention when considered in conjunction with the drawings.

BRIEF DESCRIPTION OF THE DRAWINGS

FIG. 9 illustrates a wafer and a wafer stage for use with the present invention.

FIG. 10 illustrates a mapping of signatures related to multi-layer liquid immersion medium of the present invention.

FIG. 11 illustrates a table of expected and unexpected signatures.

DETAILED DESCRIPTION OF THE INVENTION

Figure 1:
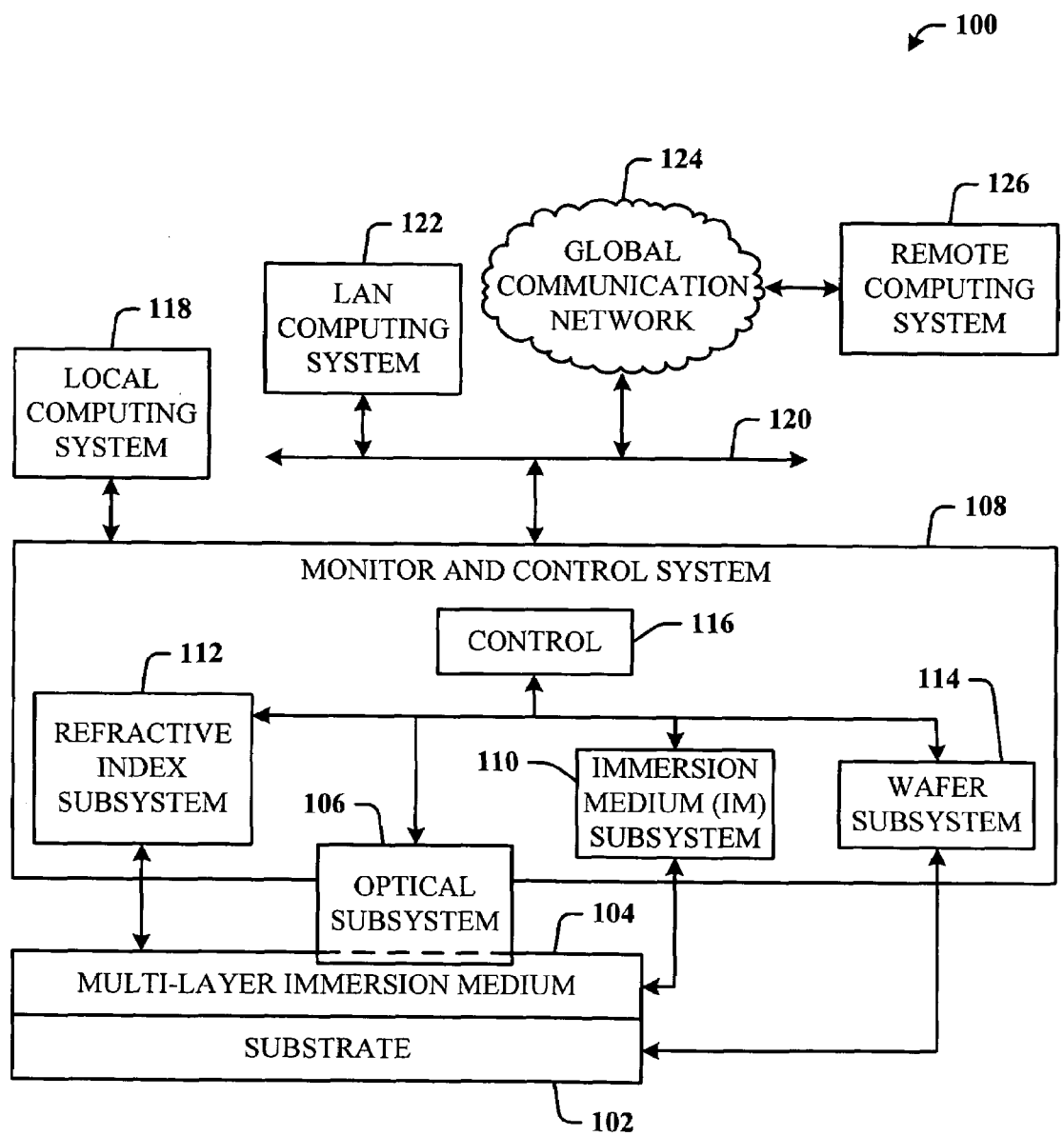
FIG. 1 illustrates a block diagram of a system for immersion lens lithography in accordance with the present invention.

The present invention is now described with reference to the drawings, wherein like reference numerals are used to refer to like elements throughout. In the following description, for purposes of explanation, numerous specific details are set forth in order to provide a thorough understanding of the present invention. It may be evident, however, that the present invention may be practiced without these specific details. In other instances, well-known structures and devices are shown in block diagram form in order to facilitate describing the present invention.

As used in this application, the terms "component" and "system" are intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on a server and the server can be a component. One or more components may reside within a process and/or thread of execution and a component may be localized on one computer and/or distributed between two or more computers.

As used herein, the term to "infer" or "inference" refer generally to the process of reasoning about or inferring states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources.

Referring now to FIG. 1, there is illustrated a block diagram of a system 100 for immersion lens lithography in accordance with the present invention. A substrate 102 is provided on which semiconductor processing is to be performed. A multi-layer immersion medium 104 is provided between the substrate 102 and a lens of an optical subsystem 106. The optical subsystem 106 is part of a monitor and control (MC) system 108 that monitors and controls many aspects of lithography processes, and includes a stepper/scanner subsystem to precisely moves the lens to the desired locations over the substrate 102.

The MC system 108 also includes an immersion medium (IM) subsystem 110 that monitors and controls at least the amounts of immersion fluids that are provided onto the substrate 102. For example, where two immersion liquids are provided with differing densities and viscosities, the IM subsystem 110 controls the flow of each of the liquids to the substrate 102, and processes signals that indicate a state of each of the liquid densities (and/or viscosities) in order to maintain the desired numerical aperture (NA) for the lithographic process. The IM subsystem 110 also includes sensors that make density-related (and/or viscosity-related) measurements of the different liquids employed in the multi-layer immersion medium 104, and maintains a fresh flow of the liquids onto the substrate 102. Where two liquids are utilized, the bottom viscous layer provides a benefit of reducing turbulence in the liquids during exposure. The lens moves in the top less dense layer and then lowers into the bottom layer more dense layer during exposure.

The MC 108 includes a refractive index subsystem 112 (e.g., scatterometry) that monitors the median optical properties of the immersion medium 104. A wafer subsystem 114 provides monitor and control of mechanical and electrical processes associated with the substrate 102. A control component 116 provides central processing and control for the MC system 108, and interfaces to the optical subsystem 106, the IM subsystem 110, the refractive index subsystem 112, and the wafer subsystem 114. Other subsystems that can be interfaced to the MC system 108, but are not shown, can include a process chamber, gas systems, and many other process and analysis systems normally employed in semiconductor fabrication and processing.

The MC system 108 can operate standalone, in that a local computing system 118 can interface directly thereto for the communication of data and signals therebetween. The capabilities of the local computing system 118 can further be configured into the MC system 108, thus eliminating the need for the external local computing system 118, or similar capabilities of a separate computing system can be employed internally in combination with the external local system 118.

The MC system 108 can also be disposed in wired or wireless communication with a local area network (LAN) 120, such that the data and signals can be transmitted to networked computing systems, e.g., a LAN-based computing system 122. Further, the LAN 120 can interface to a global communication network (GCN) 124 (e.g., the Internet) such that the data and signals can be communicated to a remote computing system 126 disposed on the GCN 124. Thus, a user can log into the remote system 126, and upon successful authentication to the LAN 108, can gain access to the data and signals of the lithographic process provided by the MC system 108. The user can then simply monitor the processes, or even effect changes in system parameters to alter the way the lithographic process is performing. The user interface (UI) can be in the form of a web-page interface that exposes process data to the user. In one implementation, the system will expose more monitor and control to a user with greater security rights, and less information to a user with fewer security rights.

The multi-layer immersion medium 104 occupies the gap between the substrate 102 (e.g., wafer) and a final optical component (e.g., the lens). Characteristics of the immersion medium 104 can include low optical absorption at the exposure radiation wavelength, compatibility with resist and lens material, uniformity of properties throughout the immersion medium 104, non-contaminating, etc. The immersion medium 104 can be, for example, ultrapure water, oil (e.g., perfluorinated polyethers (PFPE) including PFPE-K, PFPE-Y, PFPE-D, PFPE-M, PFPE-Z), etc.

The multi-layer immersion medium 104 utilized in connection with the present invention has a refractive index (n) greater than the refractive index of air. Refractive index is a ratio of speed of light in a vacuum to speed of light in a particular medium and varies dependent upon radiation wavelength. For example, the refractive index corresponding to 193 nm radiation is approximately 1.4 for water and approximately 1 for air. Furthermore, it is desirable to have a refractive index greater than one provided that the immersion medium 104 is 100% transparent to the exposure radiation wavelength. However, the invention is not intended to be limited to a 100% transparent immersion medium 104 with refractive index greater than 1, as various other transparencies are contemplated and intended to fall within the scope of the hereto appended claims.

The refractive index subsystem 112 interacts with the immersion medium 104 to facilitate monitor and/or control of the refractive index, and facilitates derivation of the refractive index (n) and/or lithographic constant (k) of the immersion medium 104. Additionally, the refractive index subsystem 112 can control refractive index and/or lithographic constant values of the immersion medium 104. For example, control of refractive index and/or lithographic constant of the immersion medium 104 can be facilitated by means of modifying temperature, altering pressure, flushing the immersion medium from the system and adding new liquid, etc.

Refractive index and/or lithographic constant values can be derived from light scattering off a known grating structure, which can be built upon the substrate 102 (e.g., wafer, wafer stage, and reticle). The substrate 102 thus can be at least partially immersed within the immersion medium 104 and subjected to radiation, which is detected and analyzed to yield values for refractive index and/or lithographic constant. It is to be appreciated that the refractive index subsystem 112 can be, for example, a scatterometry component. The present invention contemplates any suitable refractive index subsystem 112, and such systems are intended to fall within the scope of the hereto-appended claims.

Tunable values for refractive index and/or lithographic constant facilitate additional control over resolution of the photolithographic process. The refractive index subsystem 112 can facilitate change of the characteristics (e.g., refractive index and lithographic constant) of the immersion medium 104, thus resulting in control of resolution of the photolithographic process.

The immersion medium 104 can be a supercritical fluid in gaseous phase or ozone vapor (a supercritical fluid is a fluid that is at a temperature and pressure above a particular medium's critical temperature and critical pressure). While in a supercritical state, pressure can be applied to the medium to effectuate a change in the refractive index and/or lithographic constant of the immersion medium 104.

It is further to be appreciated that information gathered by the refractive index subsystem 112 can be utilized for generating feedback and/or feed-forward data that can facilitate achieving increased resolution. The system 112 for monitoring and/or controlling refractive indices can additionally employ or interface to such data to control components and/or operating parameters associated therewith. For instance, feedback/feed-forward information can be generated in connection with the immersion medium 104 to maintain, increase, or decrease temperature and/or pressure thereof.

Figure 2:
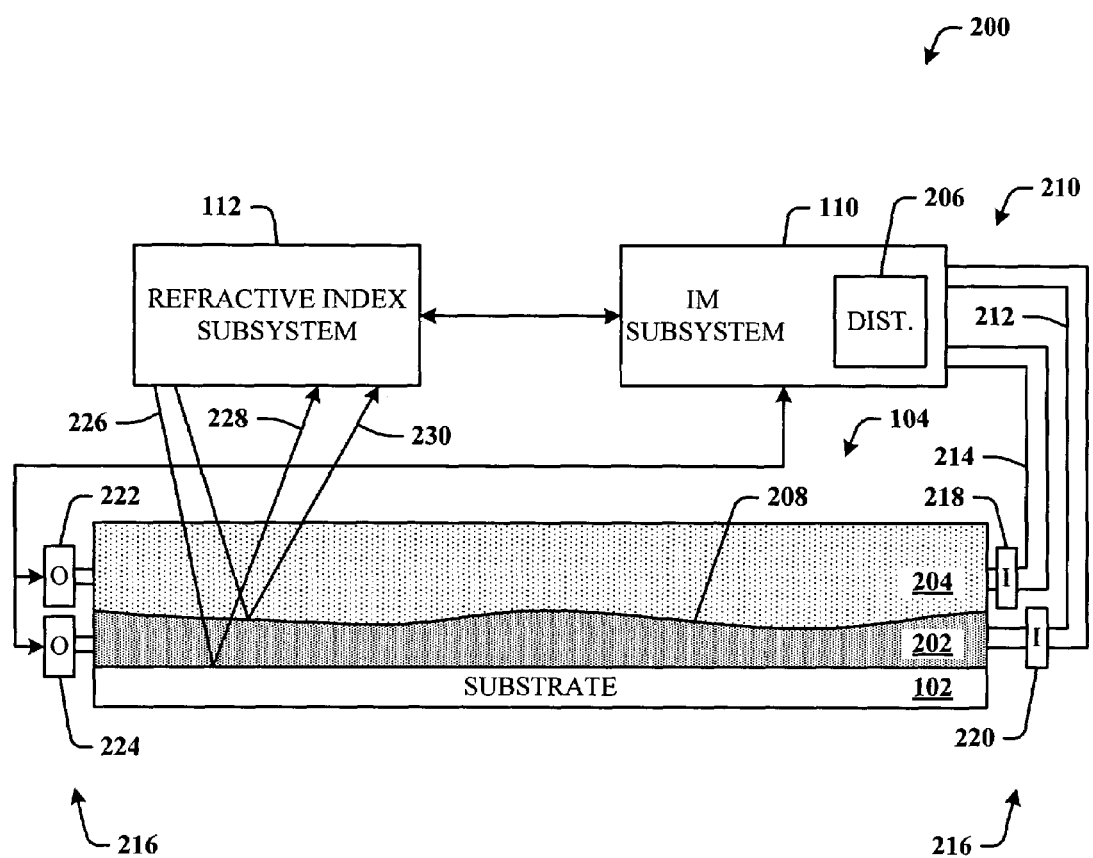
FIG. 2 illustrates a block diagram of one implementation of a multi-layer immersion medium monitor and control system in accordance with the present invention.

Referring now to FIG. 2, there is illustrated a block diagram of one implementation of a multi-layer immersion medium monitor and control system 200 in accordance with the present invention. The multi-layered medium 104 is provided over the substrate 102 in at least two layers to provide the desired NA. The immersion medium 104 includes a bottom layer 202 having a first density and a top layer 204 having a lower density. The IM subsystem 110 includes a liquid distribution and circulation subsystem 206 that provides the immersion liquids (202 and 204) of different densities and viscosities to the substrate 102. Since the densities are different, the liquid 202 with the higher density will settle to the surface of the substrate 102, and the liquid 204 with the lower density will rise up to ride on top of the liquid 202 forming a separation boundary 208 therebetween. Since the liquids are dissimilar, it may be expected that their viscosities are also different. During the step-and-scan motion of the lithography tool, the lens moves through the lower density (and lower viscosity) liquid to the inspection site. This minimizes turbulence that can contribute to instabilities. Thus, the densities of these liquids have to be different, which determines their layered position over the wafer.

The liquids (202 and 204) can be provided from separate distribution lines 210, such that a first distribution line 212 handles the higher density liquid 202, and a second distribution line 214 handles the lower density liquid 204. In another implementation, the liquids (202 and 204) are distributed together in a single distribution line (e.g., line 214), wherein after provided onto the substrate 102, the liquids separate into the multiple layers for lithographic uses.

The IM subsystem 110 also includes one or more sensors 216 for monitoring system parameters. For example, a first input sensor 218 senses flow of the top liquid 204, and a second input sensor senses flow of the bottom liquid 202. A first output sensor 222 senses density (or viscosity) data of the top liquid 204, and a second output sensor 224 senses density (or viscosity) data of the bottom liquid 202. Of course, numerous other types of sensors can be employed to ensure that the liquids are in the desired state for lithographic processes. For example, sensors that determine the amount of liquid dispensed, the height of the liquid medium 104, the liquid temperature, liquid purity of each liquid, and so on, are within contemplation of the present invention. The sensors can also employ optical means for making measurements such as shooting a light beam through the top liquid 204 from the first input sensor 218 to the first output sensor 222 in order to determine properties of the top liquid 204.

The system 200 employs the refractive index subsystem 112 to detect the median optical properties of the liquid medium 104. In a first implementation, the refractive subsystem 112 emits a first incident beam 226 through the liquid medium 104 on the substrate 102, and receives a reflected beam 228 in order to analyze the optical properties of the medium 104. In a second implementation, the refractive subsystem 112 emits a second beam 180 to the separation boundary 208 to monitor for turbulence information. The refractive index subsystem 112 interfaces to the IM subsystem 110 in order to provide feedback information that facilitates making changes to the IM subsystem 110 for the lithographic processes.

Figure 3:
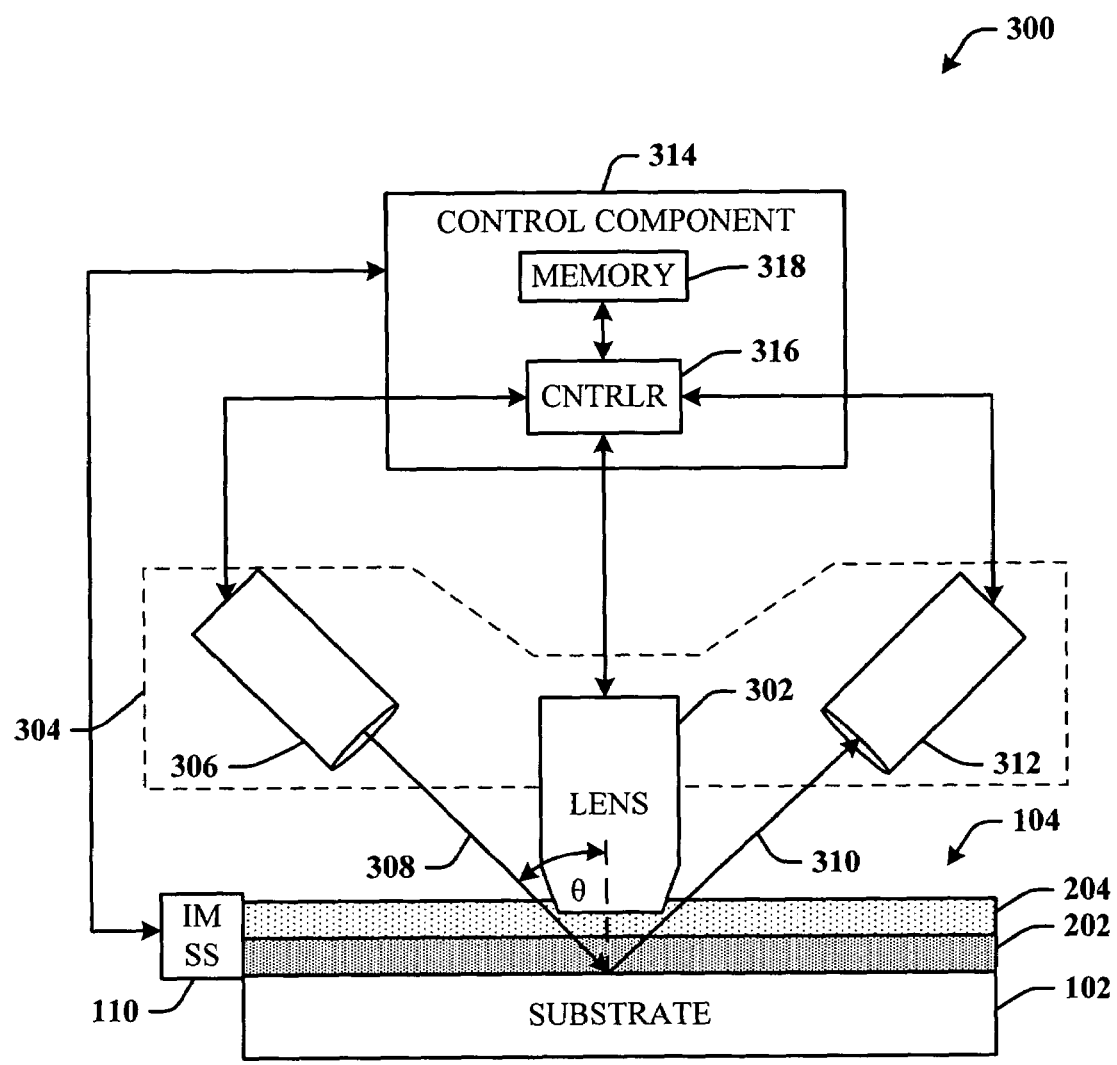
FIG. 3 illustrates a block diagram of a system for measuring and/or controlling refractive index of a multi-layer immersion medium in accordance with the present invention.

Referring now to FIG. 3, there is illustrated a block diagram of a system 300 for measuring and/or controlling refractive index of a multi-layer immersion medium 104 in accordance with the present invention. In this example, the substrate 102 (e.g., wafer, wafer stage, and reticle) with a known grating structure is at least partially within the immersion medium 104 (e.g., water, liquids of differing density and viscosity, supercritical fluid in gaseous state, and ozone vapor). Additionally, a final optical component, such as a lens 302, is also at least partially within the top liquid layer 204 of the immersion medium 104. The system 300 can also utilize a measuring system 304 for measuring features of the multi-layer immersion medium 104 in accordance with an aspect of the present invention. By way of illustration, the measuring system 304 is a non-destructive measurement tool that includes a source of light 306, such as one or more optical emitters, for emitting an incident light beam 308 toward the substrate 102 at an incident angle θ relative to a normal reference line. The incident light beam must not contain any actinic components, i.e., those wavelengths capable of exposing the photoresist material. Suitable filters may be employed to enable this. The light source 306 can be a frequency-stabilized laser; however, it will be appreciated by one skilled in the art that any laser or other suitable light source (e.g., laser diode, or helium neon (HeNe) gas laser, and halogen lamp) can be utilized in connection with the present invention.

At least a portion of the incident beam 308 is reflected and/or diffracted as a reflected beam 310. One or more optical detectors 312 receive(s) the reflected and/or diffracted beam 310. The detector(s) 312 analyze characteristics of the reflected beam 310 and can be operative to discern optical properties of the beam. As described below, the optical properties of the beam 310 represent optical characteristics of the known grating structure built on the substrate 102 and the immersion medium 104, which facilitates deriving characteristics of the immersion medium 104. The immersion medium 104 characteristics, for example, can include refractive index, numerical aperture, and lithographic constant.

By way of example, the detector 312 can include a spectrometer or any instrument capable of providing spectrally resolved information concerning the reflected beam 310. The portion of the reflected beam 310 that enters the detector 312 for analysis is determined by such portion and its associated diffraction characteristics, the special extent of the reflected beam 310, properties of the detector 312, and any associated optical elements that might be used in conjunction with the detector 312.

The detector 312 collects light reflected and/or passed through one or more gratings and/or features built upon the substrate 102 and the immersion medium 104. The measurement system 304 can extract information regarding the characteristics of the immersion medium 104 by comparing phase and/or intensity of the incident beam 308 with phase and/or intensity signals of a complex reflected and/or diffracted light associated with the reflected beam 310. The substrate 102 has a known grating structure constructed upon it, which allows for deriving characteristics of the immersion medium 104. The intensity and/or the phase of the reflected and/or diffracted light changes based on properties of the immersion medium 104.

The system 300 can further comprise a control component 314. According to one aspect of the present invention, the control component 314 can be operatively coupled to the lens 302, measurement system 304 and the immersion medium 104. The control component 314 can facilitate operation of the measurement system 304. Additionally, the control component 314 can effectuate changes in temperature, pressure, etc., of the immersion medium 104 to change refractive index and/or lithographic constant values based at least in part upon measurements obtained by the measuring system 314. Moreover, the control component 314 can further utilize such measurements to control operation of optical components such as, for example, the lens 302. Control of the lens 302 facilitates control over an exposure that is germane to a photolithographic process.

According to this aspect, the control component 314 further comprises a controller (or processor) 316 and memory 318. It is to be understood that the controller 316 can be dedicated to determining refractive index and/or lithographic constant values of the immersion medium 104, dedicated to controlling the immersion medium 104, thereby tuning the refractive index and/or lithographic constant values, or, alternatively, dedicated to at least both of determining refractive index and/or lithographic constant values and controlling tuning of the values.

The memory 318 stores program code executed by the controller 316 for carrying out operating functions of the system. The memory 318 also serves as a storage medium for temporarily storing information, such as refractive index, lithographic constant, temperature, pressure, etc., that can be employed in carrying out the present invention. The memory 318 can be either volatile memory or nonvolatile memory, or can comprise both volatile and nonvolatile memory. By way of illustration, and not limitation, nonvolatile memory can comprise read only memory (ROM), programmable ROM (PROM), electrically programmable ROM (EPROM), electrically erasable ROM (EEPROM), or flash memory. Volatile memory can comprise random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). The memory of the present systems and methods is intended to comprise, without being limited to, these and any other suitable types of memory.

The system 300 can also include the IM subsystem 110 to interface to the control component 314. This provides feedback to the control component 314 as to when to lower the lens into the bottom liquid medium layer 202 for exposure processes. Data and signals from the IM subsystem 110 can indicate to the control component 314 when the NA is at the desired value for lithographic processing on the substrate 102.

Figure 4:
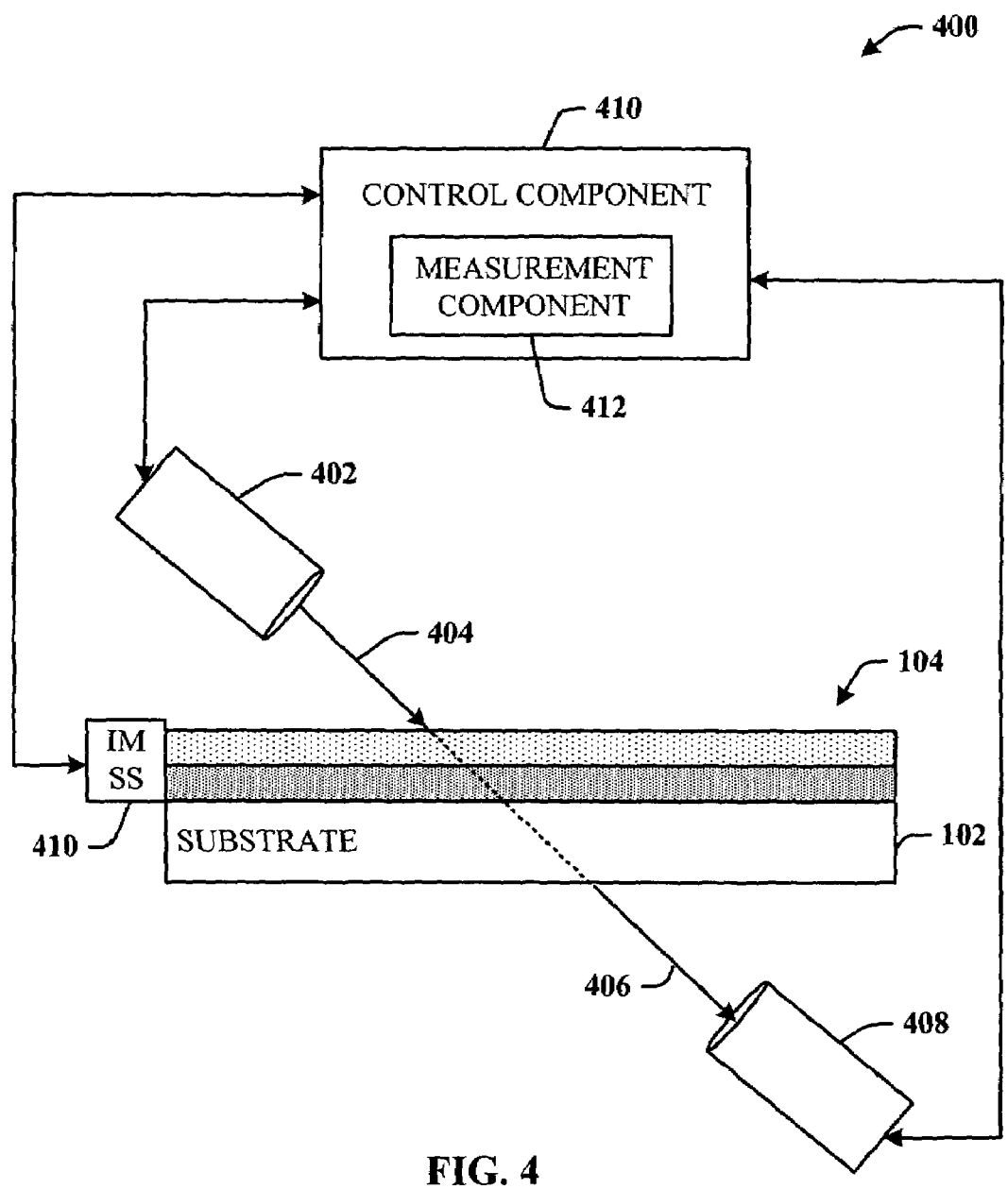
FIG. 4 illustrates a block diagram of a system that is similar in function to FIG. 3 to accommodate substrates that are partially or fully transparent.

Referring now to FIG. 4, there is illustrated a block diagram of a system 400 that is similar in function to FIG. 3 to accommodate substrates that are partially or fully transparent. The substrate 102 is at least partially within the immersion medium 104. In this example, a light source 402 provides an incident beam 404, at least a portion of which is transmitted through the substrate 102 and immersion medium 104. A diffracted and/or refracted beam 406 exits a side of the substrate 102 opposite to that of the incident beam 404. At least a portion of the diffracted beam 406 enters a detector 408, such as a spectrometer, which can be processed using known scatterometry techniques as described herein.

By way of example, a control component 410, which is operatively coupled to the light source 402, the detector 408, and the IM subsystem 110, is programmed and/or configured to control operation and/or characteristics of such components. In particular, the control component 410 includes a measurement subcomponent 412 programmed and/or configured to control operation of the light source 402 and the detector 408. As indicated below, the measurement component 412 also is programmed to determine characteristics of the immersion medium 104 based on optical data obtained by the detector 408 (e.g., spectrometer) based on the beam 404 and a known grating structure upon the substrate 102. For example, the measurement component 412 can be utilized to obtain refractive index and/or lithographic constant values of the multi-layer immersion medium 104.

The control component 410 also is programmed and/or configured to control characteristics of the immersion medium 104. The control component 410 can control temperature, pressure, exchange immersion medium, etc., to effectuate a change in characteristics of the immersion medium 104. Such characteristic changes can include, for example, varying refractive index, lithographic constant, etc.

Alternatively or additionally, the control component 410 can control characteristics of the immersion medium 104 based at least in part on measured characteristics of the immersion medium 104 obtained via the measurement component 412. In this way, operation of the measuring component 412 and the immersion medium 104 can be synchronized to facilitate tunable refractive index and lithographic constant values of the immersion medium 104, which thus accommodates increased resolution.

Figure 5:
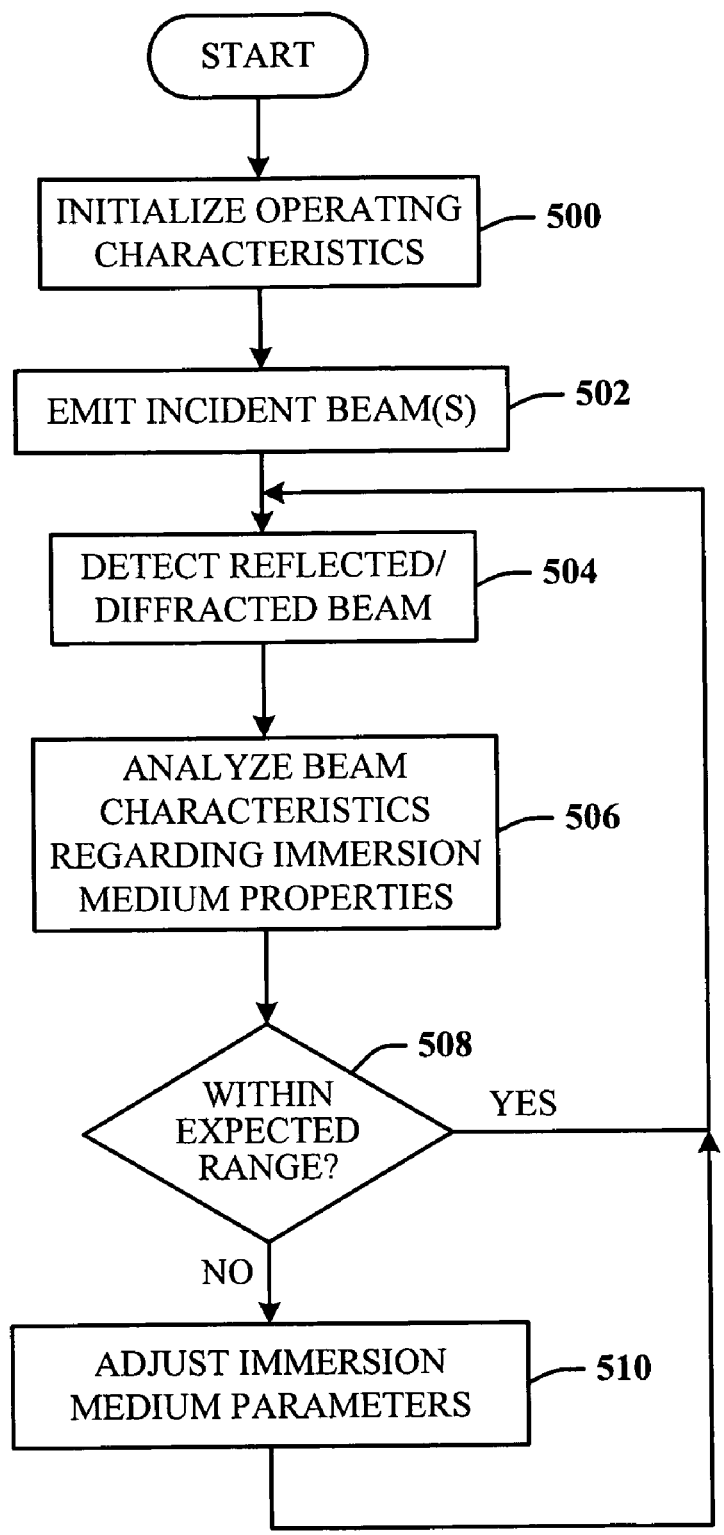
FIG. 5 illustrates a flow chart of on methodology for determining layer densities and/or viscosities in accordance with the present invention.

Referring now to FIG. 5, there is illustrated a flow chart of on methodology for determining layer densities and/or viscosities in accordance with the present invention. While, for purposes of simplicity of explanation, the one or more methodologies shown herein, e.g., in the form of a flow chart, are shown and described as a series of acts, it is to be understood and appreciated that the present invention is not limited by the order of acts, as some acts may, in accordance with the present invention, occur in a different order and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with the present invention.

At 500, the operating characteristics are initialized to starting values. This can include, for example, placing a substrate with a known grating structure at least partially into the immersion medium and/or setting initial optical parameters of an incident beam for measuring topographical characteristics of the substrate in accordance with an aspect of the present invention.

At 502, an incident beam is emitted. The incident beam, for example, is emitted as to interrogate an immersion medium and/or a substrate (e.g., wafer and wafer stage). A known grating structure is built upon the substrate. The incident beam is reflected and/or diffracted to produce a beam having characteristics indicative of substrate and/or immersion medium properties illuminated by the incident beam.

At 504, the reflected and/or diffracted beam is detected, such as using a spectrometer, although other optical detection techniques capable of detecting the reflected and/or diffracted beam could be used. At 506, optical characteristics of the reflected and/or diffracted beam, such as intensity of one or more wavelengths of the detected light, phase characteristics, refractive indices, polarization state, etc., are determined. The optical characteristics can be employed to derive an indication of multi-layered immersion medium parameters, such as refractive index, layer viscosities, layer turbulence, median optical properties (e.g., NA), and lithographic constant.

At 508, a determination is made as to whether the immersion medium characteristics are within an expected range. If the immersion medium characteristics are within an expected range of parameters, the process returns to 504 and the foregoing methodology is repeated. If the determination 508 is negative, indicating that immersion medium characteristics are outside the expected range, the process proceeds to 510, where immersion medium characteristics are adjusted by means of temperature change, pressure change, flushing immersion medium, etc.

From 510, the present iteration ends and the process returns to 504, in which the methodology continues, as described above such as for a duration commensurate with the associated fabrication process. As a result, the present invention facilitates controlling refractive index and lithographic constant of an immersion medium at a fixed exposure wavelength, and thus increases resolution.

Figure 6:
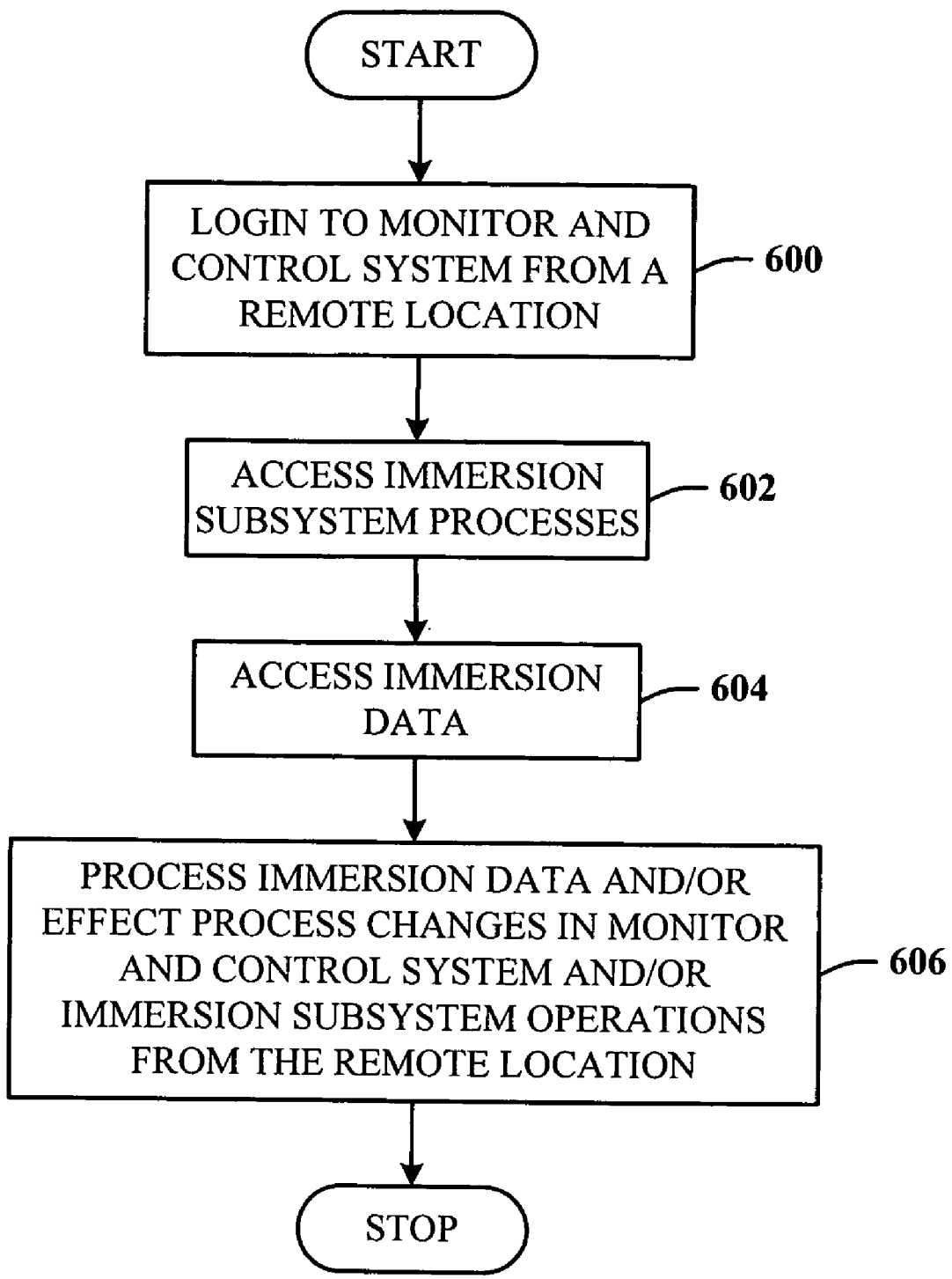
FIG. 6 illustrates a flow chart of one methodology for network access of the multi-layer immersion properties in accordance with the present invention.

Referring now to FIG. 6, there is illustrated a flow chart of one methodology for network access of the multi-layer immersion properties in accordance with the present invention. At 600, a user logs in to the monitor and control system. This can include basic network login procedures that need to be executed before network access is provided from any location. For example, the monitor and control system, by itself, can be configured to prompt the user for login information. If the user desires to login from an external computer that is directly connected to the monitor and control system, a single login or multiple logins can be provided to accommodate access to the monitor and control system. If the external computer is disposed on a LAN, various login procedures can be enforced to ensure that unauthorized access is prevented. If the external computer is disposed on an external network, added security can be imposed to ensure stricter procedures for gaining access to internals monitor and control processes.

It is within contemplation of the present invention that a user could roam within range of the monitor and control system with a hand-held portable wireless device and gain ready access to data and signals, utilizing, for example, BLUETOOTH wireless communications technology. Access could range from read-only access, and based upon the user credentials, provided limited viewing access of the data, or signals, or both data and signals. A user with more system credentials can be provided with increased access to include allowing the user to view more data and signals, and even change system parameters.

Continuing with FIG. 6, at 602, the user gains access to IM subsystem processes in order to view and even alter immersion layer characteristics. Such characteristics can be changed by altering liquid flow, purity, density, viscosity, temperature, layer turbulence, type of liquids, the number of liquids in the medium, and so on. At 604, the user accesses the immersion data. At 606, the user processes the immersion data/signals and/or effects process changes from the remote location. Such changes can be effectuated by communication directly with the monitor and control system, or the immersion medium subsystem, or both. Further access can be implemented to any of the other subsystems in the same manner. The process then reaches a Stop block.

Figure 7:
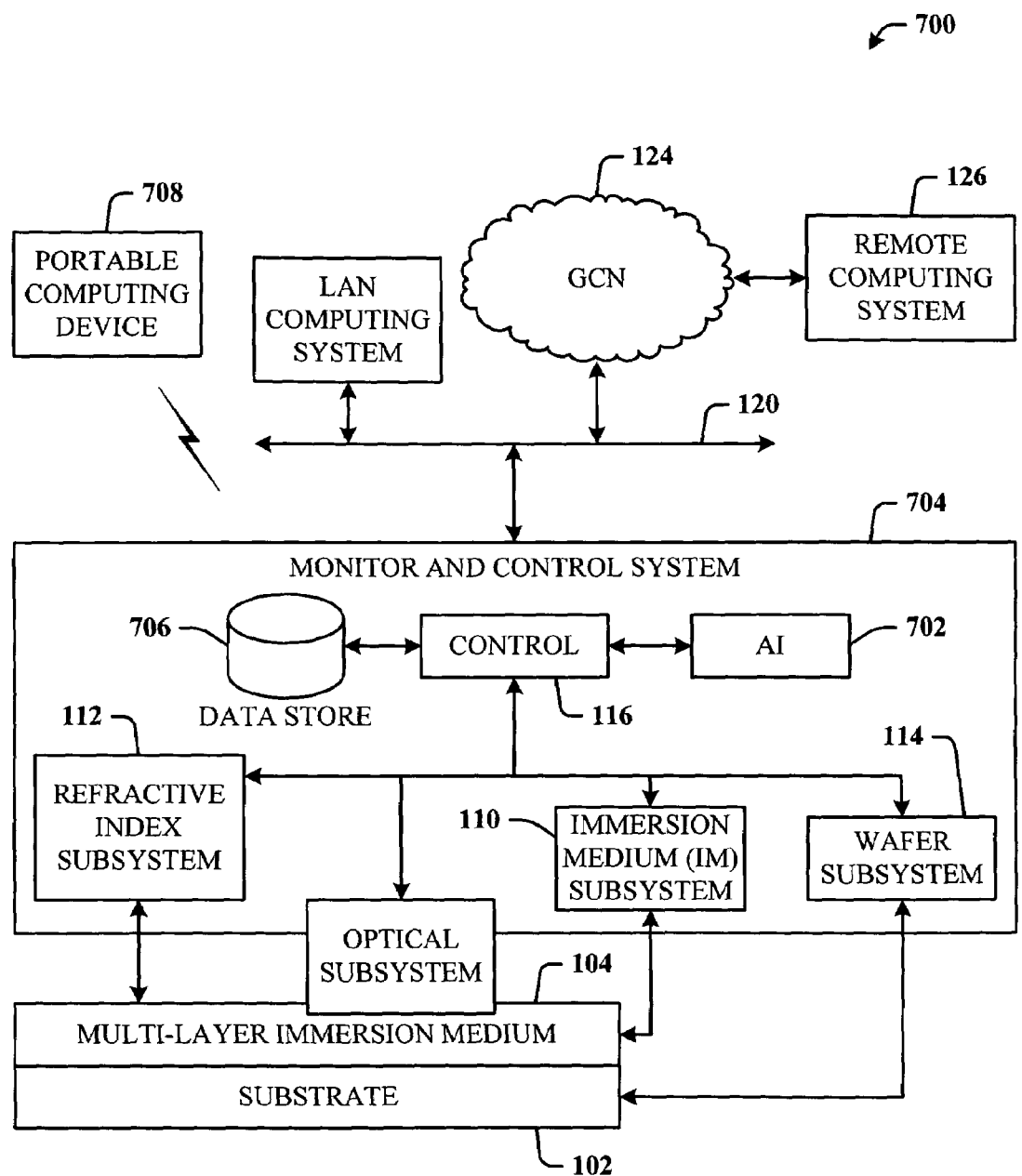
FIG. 7 illustrates a block diagram of a multi-layer immersion medium system 700 in accordance with the present invention, which further employs an artificial intelligence (AI) component.

Referring now to FIG. 7, there is illustrated a block diagram of a multi-layer immersion medium system 700 in accordance with the present invention, which further employs an artificial intelligence (AI) component 702. A monitor and control component 704 can be operatively coupled to the AI component 702 that is capable of making inferences regarding system operation and a data, which data can correspond to known grating structures on the substrate 102 or other substrates currently undergoing (or in the past have undergone) similar processing, prior multi-layer and or single layer immersion medium characteristics, previous changes to the immersion medium 104 by means of change in temperature, pressure, to name only a few.

Additionally, the AI component 702 can be operatively coupled to a data store 706 that stores process data. According to an aspect of the present invention, the AI component 702 can determine optimal changes to the immersion medium 104 which can be effectuated by the control component 704. Furthermore, the AI component 702 can store and retrieve data from the data store 706 that corresponds to the immersion medium 104 and any other subsystem (e.g., subsystems 106, 110, 112, and 114) such as, for example, refractive index values, lithographic constant values, temperatures, pressures, turbulence, median optical properties, liquid flow, liquid purity, layer viscosities, layer densities, changes implemented to immersion medium, etc., and generate AI information that is used to automate and/or improve various operations and functions of the monitor and control system. These examples are given by way of illustration only, and are not in any way intended to limit the scope of the present invention or the number of, or manner in which the AI component 702 makes inferences.

Such AI information can be accessed by the remote computing system 126 via the GCN 124 (e.g., the Internet), and/or a wireless portable computing device 708 (via the LAN 120, or direct communication with the monitor and control system 704) for local access, viewing, and interaction by a user.

Figure 8:
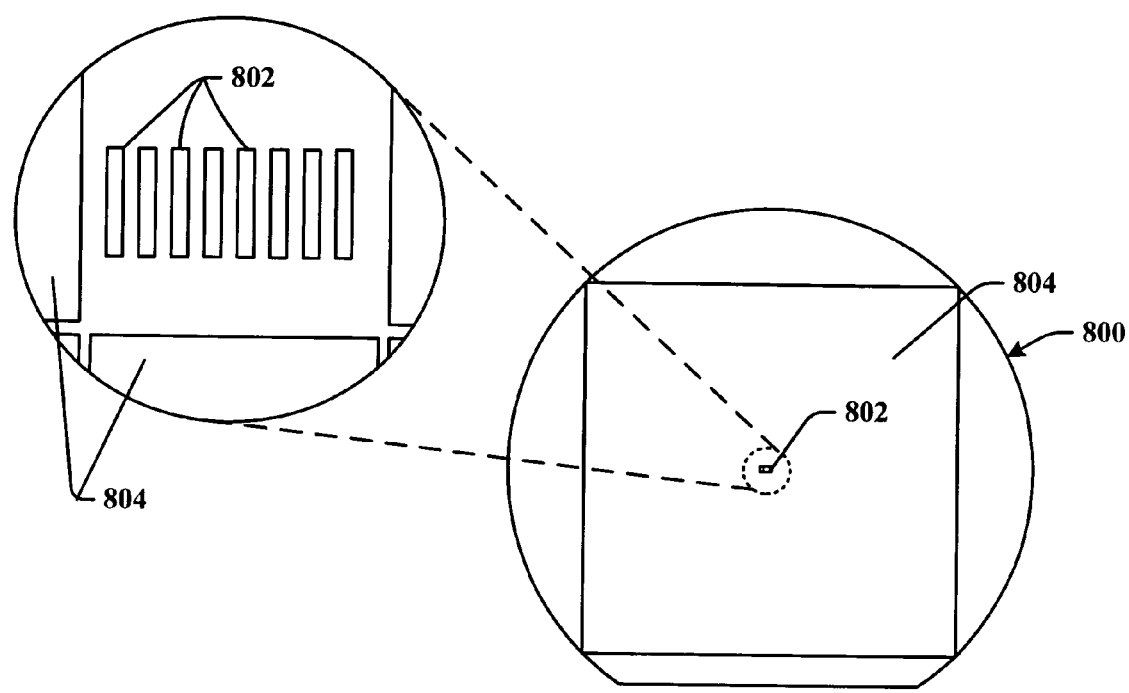
FIG. 8 illustrates a block diagram of an example substrate (e.g., wafer and wafer stage) such as can be utilized in connection with immersion lithography is illustrated for use in accordance with an aspect of the present invention.

Referring now to FIG. 8, there is illustrated a block diagram of an example substrate 800 (e.g., wafer and wafer stage) such as can be utilized in connection with immersion lithography is illustrated for use in accordance with an aspect of the present invention. Gratings 802 are located near a central region of the substrate 800 to facilitate inspection and/or measurement of an immersion medium. The gratings 802 can be located between production regions of the substrate 804 to maximize real estate associated with the substrate 800 being manufactured. Alternatively, the gratings 802 can be located upon a wafer stage and/or a wafer not subject to production. The particular grating 802 illustrated in FIG. 8 is a series of elongated parallel marks, which can be implemented as raised portions in the substrate or as troughs, such as etched into the substrate 800. It is to be appreciated that more complex (e.g., nonlinear) grating patterns and/or substrate features (e.g., lines and connectors) also could be used in accordance with an aspect of the present invention. A known grating structure can be employed in connection with the present invention and thus can facilitate deriving characteristics of an immersion medium by utilizing measurement techniques associated with the combination of substrate 800 and immersion medium.

In the case of the grating being located on the wafer substrate, it is possible to carry out scatterometry evaluation of the grating in an external environment prior to the immersion process. Since the optical characteristics of the grating on the wafer do not change, this information can be fed forward and will therefore assist in a more accurate determination of the immersion liquid properties above the wafer surface. The external evaluation may be done before or after the photoresist is coated onto the wafer.

Referring now to FIG. 9, there is illustrated a wafer 900 and a wafer stage 902 for use with the present invention. The wafer 900 situated on the stage 902 can be logically partitioned into grid blocks. Each grid block (XY) of the grid pattern corresponds to a particular portion of the wafer 900, and each grid block has a known grating structure associated with that grid block. Each portion is monitored individually for signatures generated by the known grating structure and a portion of an immersion medium.

Referring now to FIG. 10, there is illustrated a mapping 1000 of signatures related to multi-layer liquid immersion medium of the present invention. One or more portions of the immersion medium and the known grating structures in respective portions of the wafer ($X_1Y_1 \ldots X_{12}, Y_{12}$) are being monitored for signatures using reflective and/or passed-through light, a signature system and a processor. It is to be appreciated that although FIG. 10 illustrates the wafer being mapped (partitioned) into 144 grid block portions, the wafer may be mapped with any suitable number of portions and any suitable number of gratings may be employed. Given the set of recorded signatures, a processor can determine that an undesirable immersion medium characteristic (e.g., refractive index, lithographic constant, density, viscosity, and turbulence) exists. Similarly, a processor may generate feed forward information that can facilitate maintaining, terminating, and/or adjusting conditions associated with the immersion medium such as, for example temperature, and pressure.

Referring now to FIG. 11, there is illustrated a table 1100 of expected and unexpected signatures. It can be seen that all the signatures are expected except a signature for grid $X_7Y_6$. The set of depicted signatures can be analyzed collectively as a master signature and/or can be analyzed in subsets to evaluate, for example, refractive index and lithographic constant values. The analysis of the signatures can be employed to control characteristics of the immersion medium such as, for example refractive index and/or lithographic constant. Furthermore, temperature, pressure, etc., can be monitored and/or controlled in connection with the grid blocks.

Scatterometry is a technique for extracting information about a surface upon which incident light has been directed. Information concerning properties including, but not limited to, dishing, erosion, profile, chemical composition, thickness of thin films and critical dimensions of features present on a surface such as a wafer can be extracted. Furthermore, information about an immersion medium such as refractive index and lithographic constant can be extracted by utilizing scatterometry techniques. The information can be extracted by comparing the phase and/or intensity of the light directed onto the surface with phase and/or intensity signals of a complex reflected and/or diffracted light resulting from the incident light reflecting from and/or diffracting through the surface upon which the incident light was directed. The intensity and/or the phase of the reflected and/or diffracted light will change based on properties of the surface upon which the light is directed. Such properties include, but are not limited to, the chemical properties of the surface, the planarity of the surface, features on the surface, voids in the surface, and the number, type of layers beneath the surface, and refractive index of the surface.

Different combinations of the above-mentioned properties will have different effects on the phase and/or intensity of the incident light resulting in substantially unique intensity/phase signatures in the complex reflected and/or diffracted light. Thus, by examining a signal (signature) library of intensity/phase signatures, a determination can be made concerning the properties of the immersion medium utilized in connection with a known grating structure on the surface. Such substantially unique phase/intensity signatures are produced by light reflected from and/or refracted by different surfaces and/or immersion mediums due, at least in part, to the complex index of refraction of the surface onto which the light is directed. The complex index of refraction (N) can be computed by examining the index of refraction (n) of the surface and an extinction coefficient (k). One such computation of the complex index of refraction can be described by the equation:

$$N=n-jk$$

where j is the square root of (−1).

The signal (signature) library can be constructed from observed intensity/phase signatures and/or signatures generated by modeling and simulation. By way of illustration, when exposed to a first incident light of known intensity, wavelength and phase, a first feature on a wafer can generate a first phase/intensity signature. Similarly, when exposed to the first incident light of known intensity, wavelength and phase, a second feature on a wafer or of an immersion medium can generate a second phase/intensity signature. For example, a line of a first width may generate a first signature while a line of a second width may generate a second signature. Observed signatures can be combined with simulated and modeled signatures to form the signal (signature) library. Simulation and modeling can be employed to produce signatures against which measured phase/intensity signatures can be matched. In one exemplary aspect of the present invention, simulation, modeling and observed signatures are stored in a signal (signature) library containing over three hundred thousand phase/intensity signatures. Thus, when the phase/intensity signals are received from scatterometry detecting components, the phase/intensity signals can be pattern matched, for example, to the library of signals, to determine whether the signals correspond to a stored signature. The present invention contemplates any suitable scatterometry component and/or system, and such systems are intended to fall within the scope of the hereto-appended claims.

To illustrate the principles described above, reference is now made to FIGS. 12 through 17.

Figure 12:
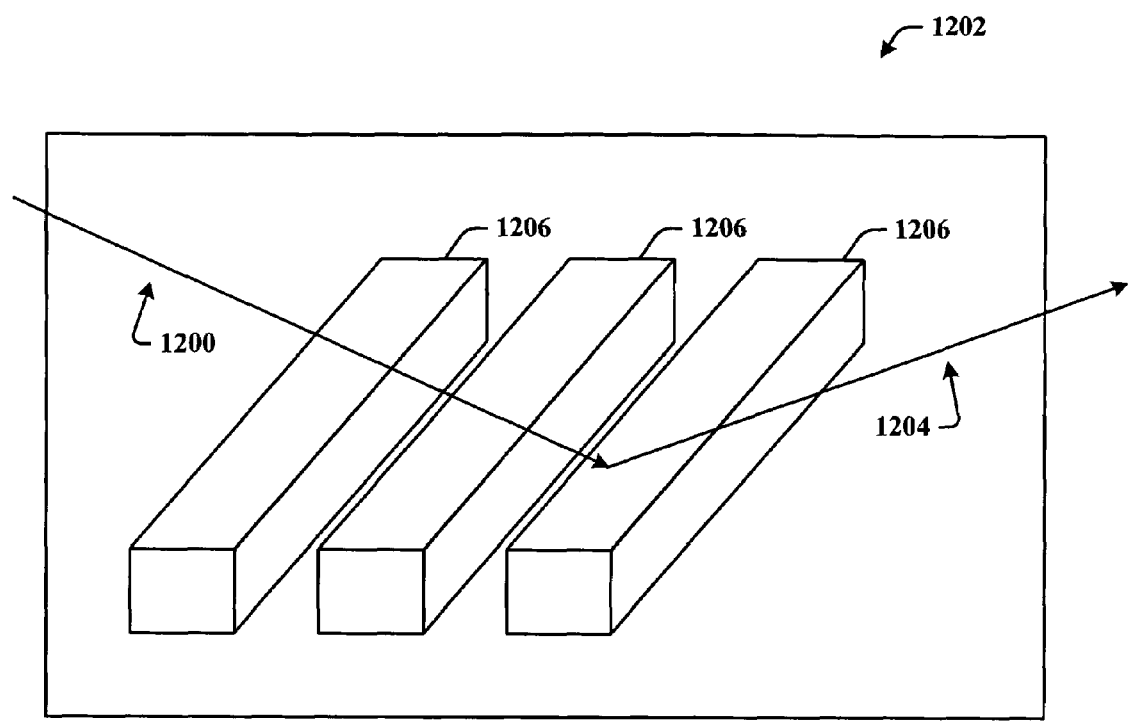
FIG. 12 illustrates a diagram of incident and reflected light of a substrate structure.

Referring now to FIG. 12, there is illustrated a diagram of incident and reflected light of a substrate structure. An incident light 1200 is directed at a surface 1202, upon which one or more features 1206 may exist. The incident light 1200 is reflected as reflected light 1204. The incident light 1200 and/or reflected light 1204 can propagate through a multi-layered immersion medium (not shown). The properties of the surface 1202, including but not limited to, thickness, uniformity, planarity, chemical composition and the presence of features, can affect the reflected light 1204. Furthermore, properties of the immersion medium can include, for example, density, viscosity, turbulence, refractive index, and lithographic constant. Features 1206 are raised upon the surface 1202. Phase and intensity data of the reflected light 1204 can be measured and plotted, as shown, for example, in FIG. 17. The phase of the reflected light 1204 can be plotted, as can the intensity of the reflected light 1204. Such plots can be employed in connection with known grating structures built upon the surface to compare measured signals with signatures stored in a signature library using techniques like pattern matching, for example.

Figure 13:
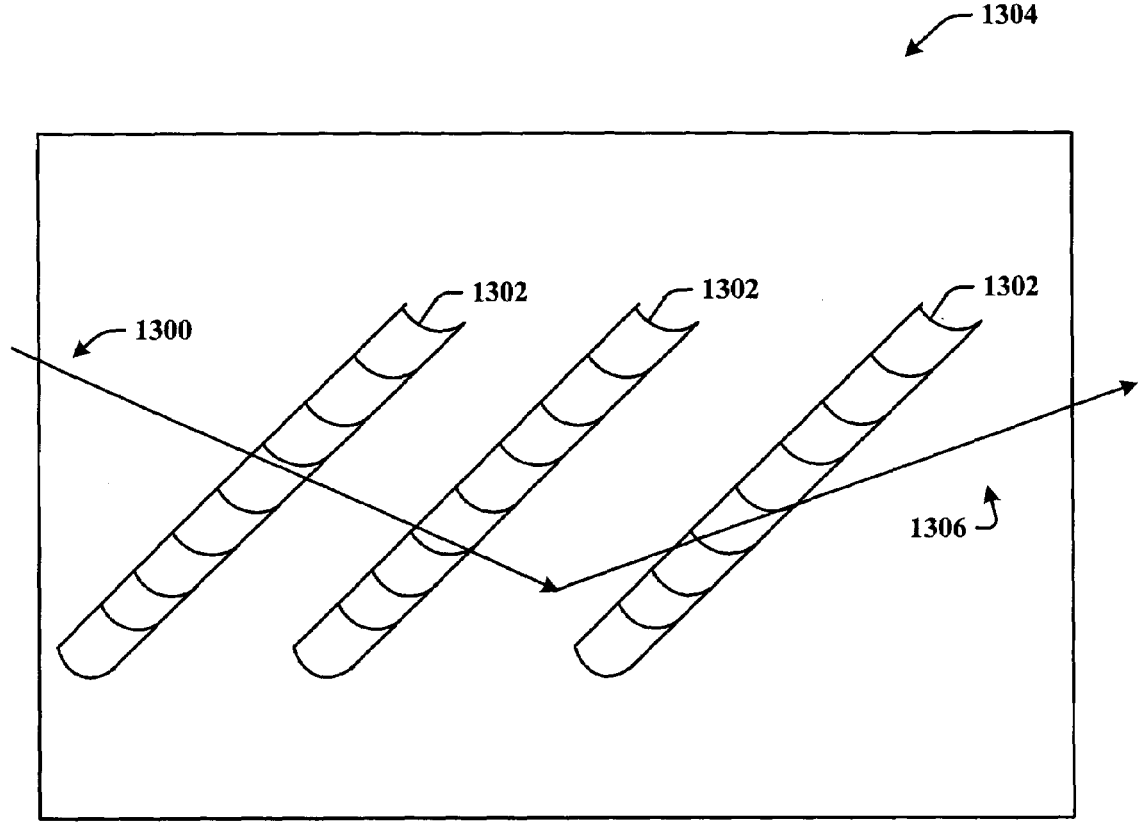
FIG. 13 illustrates a diagram of incident light 1300 being imposed on surface depressions 1302.

Referring now to FIG. 13, there is illustrated a diagram of incident light 1300 being imposed on surface depressions 1302. The incident light 1312 is directed onto a surface 1304 upon which the one or more depressions 1302 appear. The incident light 1300 is reflected as reflected light 1306. The incident light 1300 and/or reflected light 1306 can propagate through a multi-layered immersion medium (not shown). Like the one or more features of FIG. 12 may affect an incident beam, so too can the one or more depressions 1302 affect the incident beam 1300. Thus, it is to be appreciated that scatterometry can be employed to measure features appearing on a surface, features appearing in a surface, and properties of a surface itself, regardless of features. Additionally, scatterometry can be utilized to measure features of the immersion medium, which can be derived by employing a surface with a known grating structure.

Figure 14:
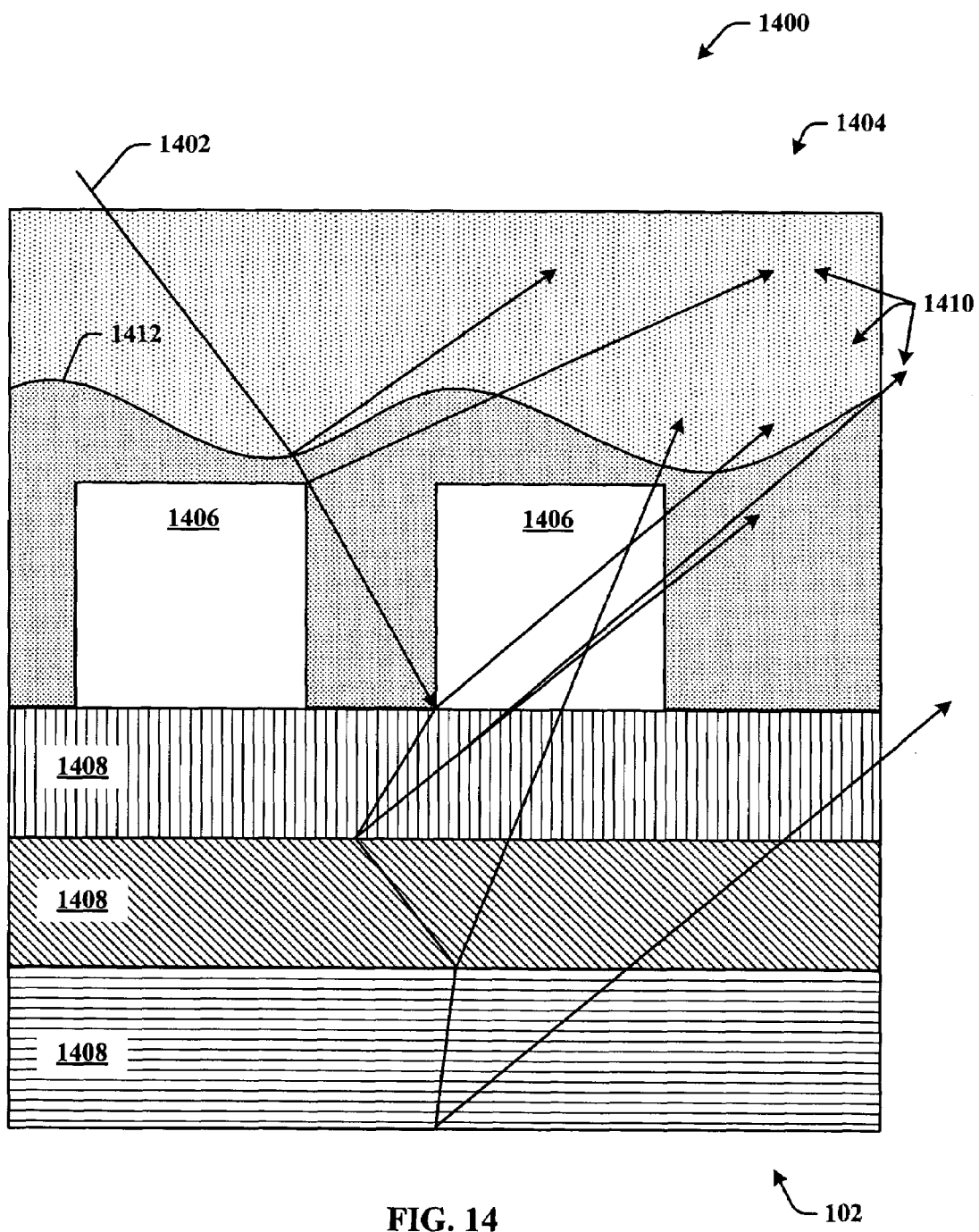
FIG. 14 illustrates a diagram of complex reflections and refractions of an incident light on a multi-layered medium and semiconductor structures in accordance with the present invention.

Referring now to FIG. 14, there is illustrated a diagram 1400 of complex reflections and refractions of an incident light 1402 on a multi-layered medium 1404 and semiconductor structures in accordance with the present invention. The reflection and refraction of the incident light 1402 in semiconductor structures can be affected by many factors including, but not limited to, the presence of one or more surface features 1406 and substrate layers 1408, the composition of the substrate 102 upon which the features 1406 reside and characteristics of a multi-layer immersion medium 1404. For example, properties of the substrate 102 include, but are not limited to, the thickness of a layers 1408, the chemical composition of the layers 1408, and the opacity and/or reflectivity of the layers 1408 can affect the reflection and/or refraction of the incident light 1402.

Additionally, properties of the immersion medium 1404 can include, for example, refractive index, NA, density values, viscosity values, turbulence metrics, and lithographic constant. Thus, a complex reflected and/or refracted light 1410 can result from the incident light 1402 interacting with an immersion medium layer boundary 1412, features 1406, and/or the layers 1408. Although three layers 1408 are illustrated, it is to be appreciated that the substrate 102 can be formed of a greater or lesser number of such layers, and sublayer device structures, further altering the reflected/refracted light 1410. According to one aspect of the present invention, a substrate with a known grating structure is utilized, which facilitates deriving characteristics of the immersion medium (e.g., refractive index and lithographic constant) by detecting scattered light.

Figure 15:
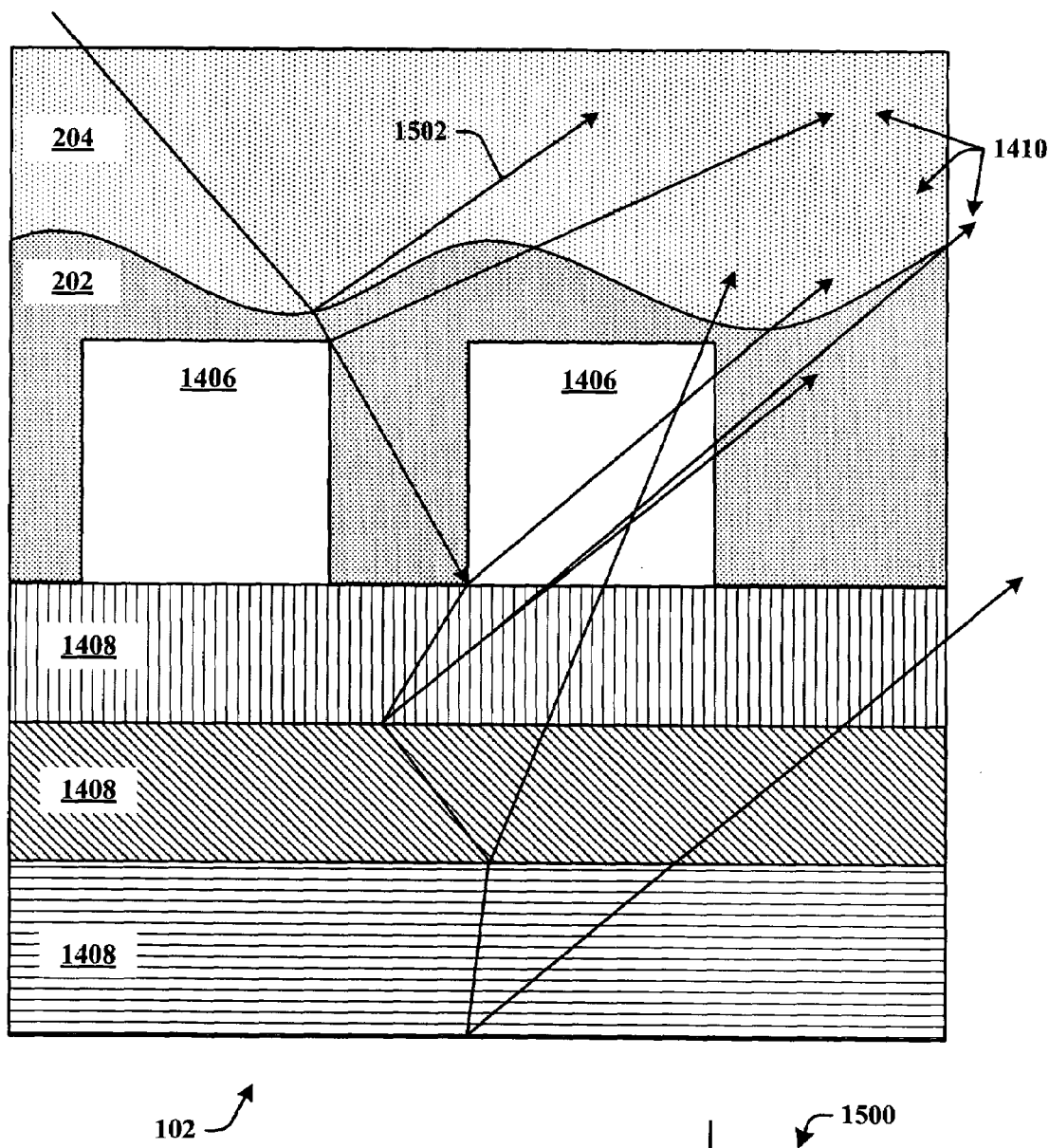
FIG. 15 illustrates a diagram of the structure of FIG. 14 where phase data is generated.

Referring now to FIG. 15, there is illustrated a diagram of the structure of FIG. 14 where phase data is generated. The substrate 102 can be formed of the one or more layers 1408. The phase 1500 of the reflected and/or refracted light 1410 can depend, at least in part, on the thicknesses, densities, and viscosities of the immersion medium layers (202 and 204), structures 1406, and thicknesses of the substrate layers 1408, for example.

Figure 16:
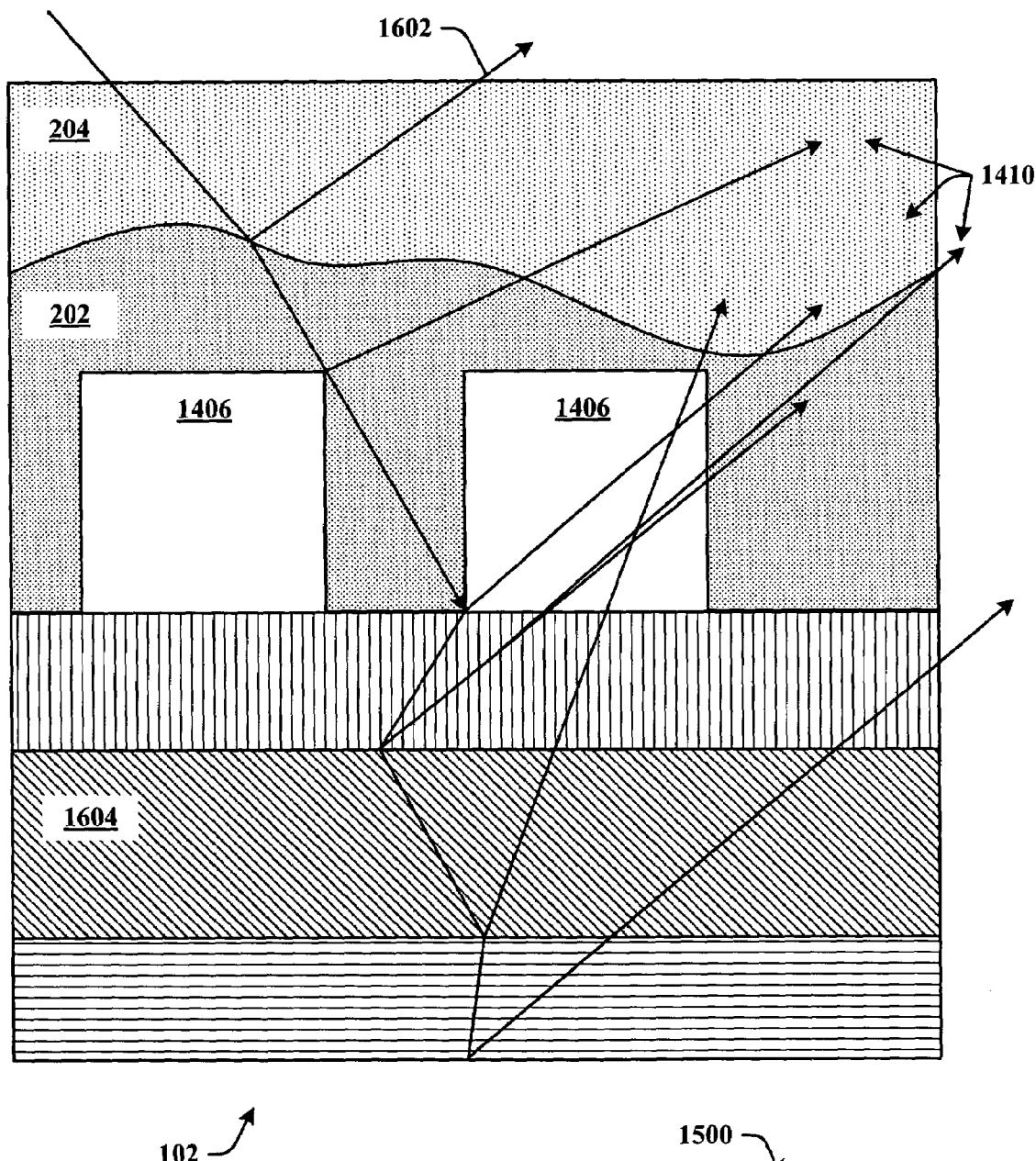
FIG. 16 illustrates a diagram of a semiconductor structure where sets of phase data related to immersion medium are generated and compared.

Referring now to FIG. 16, there is illustrated a diagram of a semiconductor structure where sets of phase data related to immersion medium are generated and compared. In FIG. 16, the phase 1600 of a reflected light 1602 differs from the phase 1500 of reflected light 1502 of FIG. 15 due, at least in part, to the different thicknesses of the immersion medium layers.

Thus, scatterometry is a technique that can be employed to extract information about a surface and/or multi-layer immersion medium upon which an incident light has been directed. The information can be extracted by analyzing phase and/or intensity signals of a complex reflected and/or diffracted light. The intensity and/or the phase of the reflected and/or diffracted light will change based on properties of the surface and/or immersion medium, and immersion medium boundary(s) upon which the light is directed, resulting in substantially unique signatures that can be analyzed to determine one or more properties of the surface and/or immersion medium upon which the incident light was directed.

Figure 17:
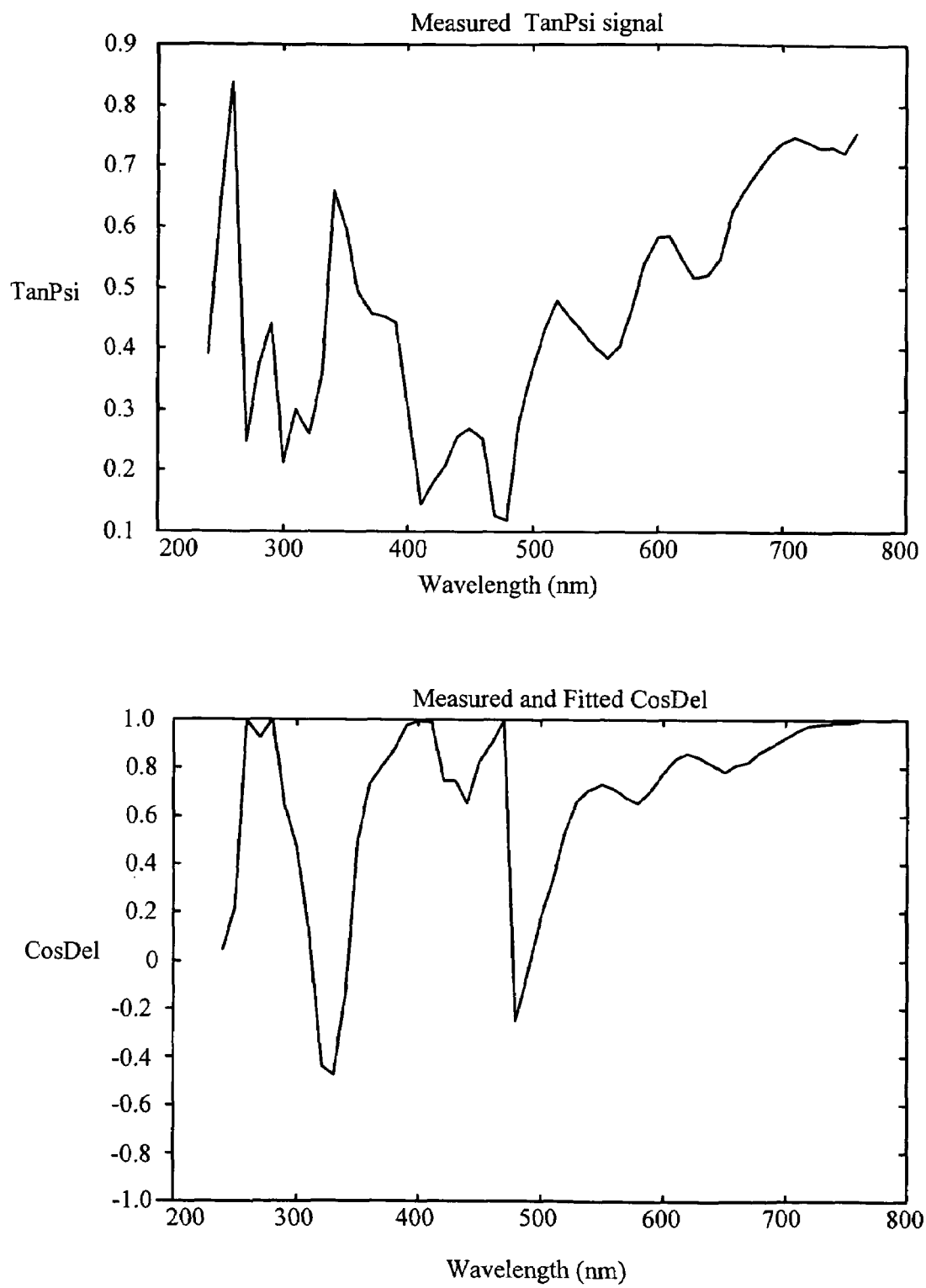
FIG. 17 illustrates phase and/or intensity signals recorded from a complex reflected and refracted light produced when an incident light is directed onto a surface in accordance with one or more aspects of the present invention.

Referring now to FIG. 17, there is an illustration of phase and/or intensity signals recorded from a complex reflected and refracted light produced when an incident light is directed onto a surface in accordance with one or more aspects of the present invention.

Figure 18:
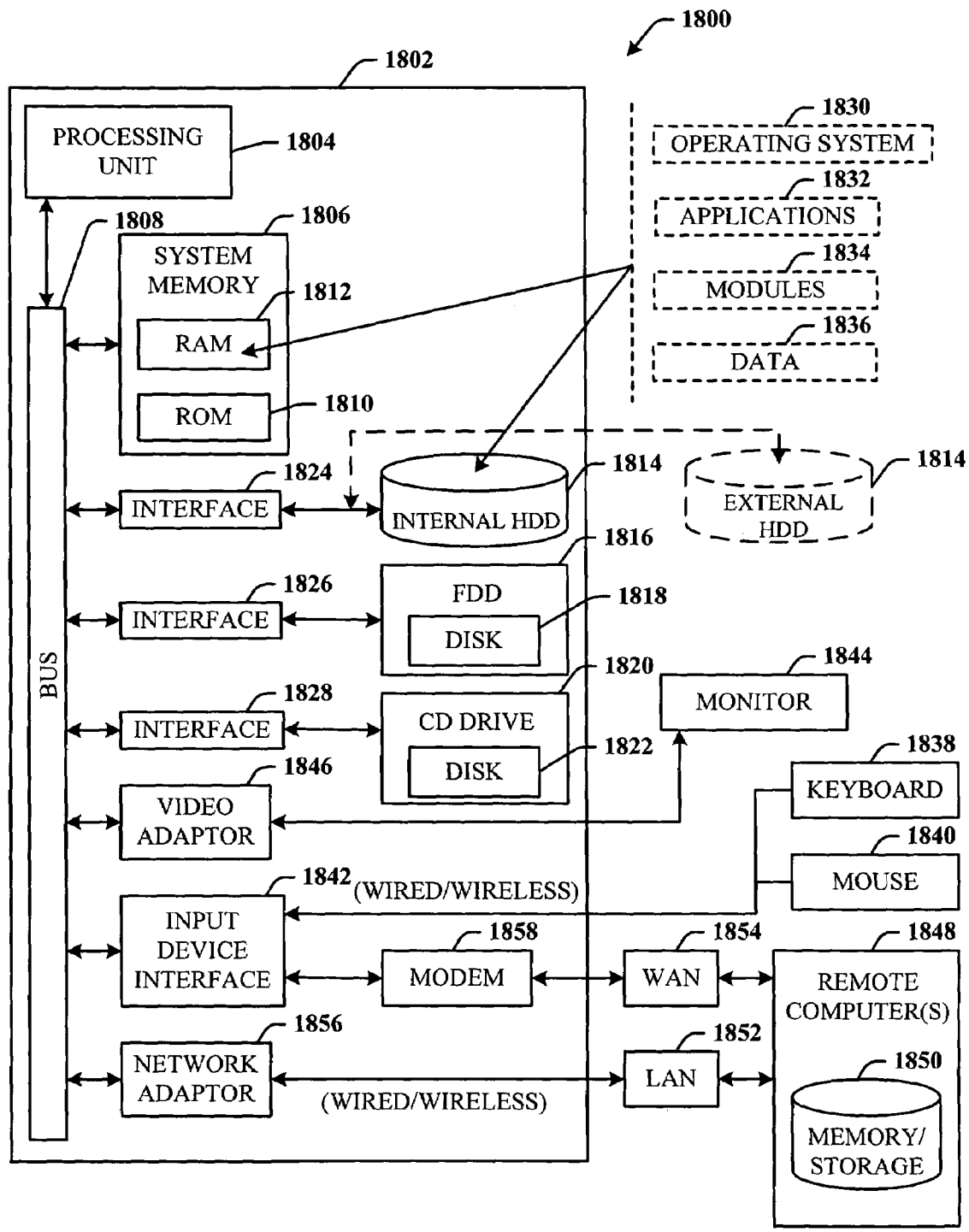
FIG. 18 illustrates a block diagram of a computer operable to execute the disclosed architecture.

Referring now to FIG. 18, there is illustrated a block diagram of a computer operable to execute the disclosed architecture. In order to provide additional context for various aspects of the present invention, FIG. 18 and the following discussion are intended to provide a brief, general description of a suitable computing environment 1800 in which the various aspects of the present invention can be implemented. While the invention has been described above in the general context of computer-executable instructions that may run on one or more computers, those skilled in the art will recognize that the invention also can be implemented in combination with other program modules and/or as a combination of hardware and software.

Generally, program modules include routines, programs, components, data structures, etc., that perform particular tasks or implement particular abstract data types. Moreover, those skilled in the art will appreciate that the inventive methods can be practiced with other computer system configurations, including single-processor or multiprocessor computer systems, minicomputers, mainframe computers, as well as personal computers, hand-held computing devices, microprocessor-based or programmable consumer electronics, and the like, each of which can be operatively coupled to one or more associated devices.

The illustrated aspects of the invention may also be practiced in distributed computing environments where certain tasks are performed by remote processing devices that are linked through a communications network. In a distributed computing environment, program modules can be located in both local and remote memory storage devices.

A computer typically includes a variety of computer-readable media. Computer-readable media can be any available media that can be accessed by the computer and includes both volatile and nonvolatile media, removable and non-removable media. By way of example, and not limitation, computer readable media can comprise computer storage media and communication media. Computer storage media includes both volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital video disk (DVD) or other optical disk storage, magnetic cassettes, magnetic tape, magnetic disk storage or other magnetic storage devices, or any other medium which can be used to store the desired information and which can be accessed by the computer.

Communication media typically embodies computer-readable instructions, data structures, program modules or other data in a modulated data signal such as a carrier wave or other transport mechanism, and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of the any of the above should also be included within the scope of computer-readable media.

With reference again to FIG. 18, there is illustrated an exemplary environment 1800 for implementing various aspects of the invention that includes a computer 1802, the computer 1802 including a processing unit 1804, a system memory 1806 and a system bus 1808. The system bus 1808 couples system components including, but not limited to, the system memory 1806 to the processing unit 1804. The processing unit 1804 can be any of various commercially available processors. Dual microprocessors and other multi-processor architectures may also be employed as the processing unit 1804.

The system bus 1808 can be any of several types of bus structure that may further interconnect to a memory bus (with or without a memory controller), a peripheral bus, and a local bus using any of a variety of commercially available bus architectures. The system memory 1806 includes read only memory (ROM) 1810 and random access memory (RAM) 1812. A basic input/output system (BIOS) is stored in a non-volatile memory 1810 such as ROM, EPROM, EEPROM, which BIOS contains the basic routines that help to transfer information between elements within the computer 1802, such as during start-up. The RAM 1812 can also include a high-speed RAM such as static RAM for caching data.

The computer 1802 further includes an internal hard disk drive (HDD) 1814 (e.g., EIDE, SATA), which internal hard disk drive 1814 may also be configured for external use in a suitable chassis (not shown), a magnetic floppy disk drive (FDD) 1816, (e.g., to read from or write to a removable diskette 1818) and an optical disk drive 1820, (e.g., reading a CD-ROM disk 1822 or, to read from or write to other high capacity optical media such as the DVD). The hard disk drive 1814, magnetic disk drive 1816 and optical disk drive 1820 can be connected to the system bus 1808 by a hard disk drive interface 1824, a magnetic disk drive interface 1826 and an optical drive interface 1828, respectively. The interface 1824 for external drive implementations includes at least one or both of Universal Serial Bus (USB) and IEEE 1394 interface technologies.

The drives and their associated computer-readable media provide nonvolatile storage of data, data structures, computer-executable instructions, and so forth. For the computer 1802, the drives and media accommodate the storage of any data in a suitable digital format. Although the description of computer-readable media above refers to a HDD, a removable magnetic diskette, and a removable optical media such as a CD or DVD, it should be appreciated by those skilled in the art that other types of media which are readable by a computer, such as zip drives, magnetic cassettes, flash memory cards, cartridges, and the like, may also be used in the exemplary operating environment, and further, that any such media may contain computer-executable instructions for performing the methods of the present invention.

A number of program modules can be stored in the drives and RAM 1812, including an operating system 1830, one or more application programs 1832, other program modules 1834 and program data 1836. All or portions of the operating system, applications, modules, and/or data can also be cached in the RAM 1812.

It is appreciated that the present invention can be implemented with various commercially available operating systems or combinations of operating systems.

A user can enter commands and information into the computer 1802 through one or more wired/wireless input devices, e.g., a keyboard 1838 and a pointing device, such as a mouse 1840. Other input devices (not shown) may include a microphone, an IR remote control, a joystick, a game pad, a stylus pen, touch screen, or the like. These and other input devices are often connected to the processing unit 1804 through an input device interface 1842 that is coupled to the system bus 1808, but can be connected by other interfaces, such as a parallel port, an IEEE 1394 serial port, a game port, a USB port, an IR interface, etc.

A monitor 1844 or other type of display device is also connected to the system bus 1808 via an interface, such as a video adapter 1846. In addition to the monitor 1844, a computer typically includes other peripheral output devices (not shown), such as speakers, printers etc.

The computer 1802 may operate in a networked environment using logical connections via wired and/or wireless communications to one or more remote computers, such as a remote computer(s) 1848. The remote computer(s) 1848 can be a workstation, a server computer, a router, a personal computer, portable computer, microprocessor-based entertainment appliance, a peer device or other common network node, and typically includes many or all of the elements described relative to the computer 1802, although, for purposes of brevity, only a memory storage device 1850 is illustrated. The logical connections depicted include wired/wireless connectivity to a local area network (LAN) 1852 and/or larger networks, e.g., a wide area network (WAN) 1854. Such LAN and WAN networking environments are commonplace in offices, and companies, and facilitate enterprise-wide computer networks, such as intranets, all of which may connect to a global communication network, e.g., the Internet.

When used in a LAN networking environment, the computer 1802 is connected to the local network 1852 through a wired and/or wireless communication network interface or adapter 1856. The adaptor 1856 may facilitate wired or wireless communication to the LAN 1852, which may also include a wireless access point disposed thereon for communicating with the wireless adaptor 1856. When used in a WAN networking environment, the computer 1802 can include a modem 1858, or is connected to a communications server on the LAN, or has other means for establishing communications over the WAN 1854, such as by way of the Internet. The modem 1858, which can be internal or external and a wired or wireless device, is connected to the system bus 1808 via the serial port interface 1842. In a networked environment, program modules depicted relative to the computer 1802, or portions thereof, can be stored in the remote memory/storage device 1850. It will be appreciated that the network connections shown are exemplary and other means of establishing a communications link between the computers can be used.

The computer 1802 is operable to communicate with any wireless devices or entities operatively disposed in wireless communication, e.g., a printer, scanner, desktop and/or portable computer, portable data assistant, communications satellite, any piece of equipment or location associated with a wirelessly detectable tag (e.g., a kiosk, news stand, restroom), and telephone. This includes at least Wi-Fi and Bluetooth™ wireless technologies. Thus, the communication can be a predefined structure as with conventional network or simply an ad hoc communication between at least two devices.

Wi-Fi, or Wireless Fidelity, allows connection to the Internet from a couch at home, a bed in a hotel room or a conference room at work, without wires. Wi-Fi is a wireless technology like a cell phone that enables such devices, e.g., computers, to send and receive data indoors and out; anywhere within the range of a base station. Wi-Fi networks use radio technologies called IEEE 802.11 (a, b, g, etc.) to provide secure, reliable, fast wireless connectivity. A Wi-Fi network can be used to connect computers to each other, to the Internet, and to wired networks (which use IEEE 802.3 or Ethernet). Wi-Fi networks operate in the unlicensed 2.4 and 5 GHz radio bands, at an 11 Mbps (802.11a) or 54 Mbps (802.11b) data rate or with products that contain both bands (dual band), so the networks can provide real-world performance similar to the basic 10BaseT wired Ethernet networks used in many offices.

Figure 19:
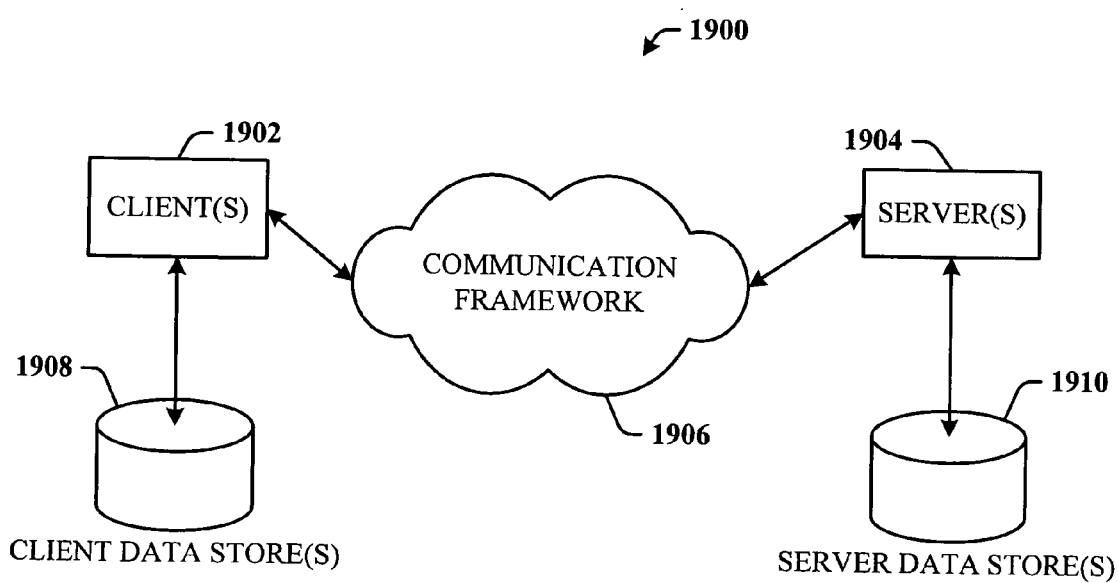
FIG. 19 illustrates a schematic block diagram of an exemplary computing environment in accordance with the present invention.

Referring now to FIG. 19, there is illustrated a schematic block diagram of an exemplary computing environment 1900 in accordance with the present invention. The system 1900 includes one or more client(s) 1902. The client(s) 1902 can be hardware and/or software (e.g., threads, processes, computing devices). The client(s) 1902 can house cookie(s) and/or associated contextual information by employing the present invention, for example. The system 1900 also includes one or more server(s) 1904. The server(s) 1904 can also be hardware and/or software (e.g., threads, processes, computing devices). The servers 1904 can house threads to perform transformations by employing the present invention, for example. One possible communication between a client 1902 and a server 1904 can be in the form of a data packet adapted to be transmitted between two or more computer processes. The data packet may include a cookie and/or associated contextual information, for example. The system 1900 includes a communication framework 1906 (e.g., a global communication network such as the Internet) that can be employed to facilitate communications between the client(s) 1902 and the server(s) 1904.

Communications can be facilitated via a wired (including optical fiber) and/or wireless technology. The client(s) 1902 are operatively connected to one or more client data store(s) 1908 that can be employed to store information local to the client(s) 1902 (e.g., cookie(s) and/or associated contextual information). Similarly, the server(s) 1904 are operatively connected to one or more server data store(s) 1910 that can be employed to store information local to the servers 1904.

What has been described above includes examples of the present invention. It is, of course, not possible to describe every conceivable combination of components or methodologies for purposes of describing the present invention, but one of ordinary skill in the art may recognize that many further combinations and permutations of the present invention are possible. Accordingly, the present invention is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A system that monitors characteristics of an immersion medium of a semiconductor manufacturing process, comprising:
    a multi-layer immersion medium interspersed between a final optical component and a semiconductor layer; and
    a system component that monitors a characteristic of the multi-layer immersion medium to effectuate control of one or more systems of the semiconductor manufacturing process.

2. The system of claim 1, wherein the multi-layer immersion medium includes a first liquid of a first density and a second liquid of a lower density.

3. The system of claim 1, wherein the system component is a scatterometry subsystem.

4. The system of claim 1, wherein the system component monitors turbulence in the multi-layer immersion medium.

5. The system of claim 1, wherein the system component monitors at least one of density and viscosity of one or more layers of the multi-layer immersion medium.

6. The system of claim 1, wherein the system component measures optical properties of the multi-layer immersion medium.

7. The system of claim 6, wherein the measured optical properties are represented as a median value.

8. The system of claim 1, wherein the multi-layer immersion medium includes a bottom layer that reduces turbulence during a lithographic process.

9. The system of claim 1, wherein the final optical component moves in an upper layer of the multi-layer immersion medium, and is positioned in a bottom layer of the multi-layer immersion medium during an exposure process.

10. The system of claim 1, wherein the system component is accessible from a remote location such that at least one of data and signals can be accessed.

11. A system that monitors characteristics of an immersion medium of a semiconductor manufacturing process, comprising:
    a multi-layer immersion medium interspersed between an optical component and a semiconductor layer, which multi-layer immersion medium includes a first liquid of a first density and a second liquid of a lower density; and
    a component that measures an optical characteristic of the multi-layer immersion medium and facilitates control of a lithographic process.

12. The system of claim 11, wherein the component is a scatterometry subsystem that measures a median optical property of one or more layers of the multi-layer immersion medium.

13. The system of claim 11, wherein the component is accessible from a remote computing device disposed in at least one of wired and wireless communications therewith.

14. A method of controlling a semiconductor manufacturing process that employs an immersion medium, comprising:
    providing a multi-layer immersion medium in contact with a semiconductor substrate;
    monitoring one or more properties of the multi-layer immersion medium; and
    processing at least one of data and signals associated with the multi-layer immersion medium to effectuate control of the semiconductor manufacturing process.

15. The method of claim 14, wherein the one or more properties of the multi-layer immersion medium include at least one of flow, purity, density, and viscosity of one of the layers thereof.

16. The method of claim 14, further comprising accessing the data and signals from a remote location to effectuate the control therefrom.

17. The method of claim 14, wherein at least one of the acts of monitoring and processing is performed by a scatterometry system.

18. The method of claim 14, further comprising reducing turbulence in the multi-layer immersion medium by providing a higher density liquid.

19. The method of claim 14, further comprising inspecting the semiconductor substrate using a final optical component, the act of inspecting further comprising:

moving a lens element of the final optical component in an upper layer of the multi-layer immersion medium; and lowering the lens element into a lower layer of the multi-layer immersion medium when inspecting the substrate.

20. The method of claim 14, wherein the one or more properties are associated with generating a numerical aperture value to effectuate control of a lithographic process.

* * * * *